(12) United States Patent
Higashi et al.

(10) Patent No.: US 6,500,701 B2
(45) Date of Patent: Dec. 31, 2002

(54) METHOD OF MANUFACTURING THIN FILM TRANSISTOR PANEL HAVING PROTECTIVE FILM OF CHANNEL REGION

(75) Inventors: Toshiaki Higashi, Yokohama (JP); Tatsuya Miyakawa, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/838,842

(22) Filed: Apr. 20, 2001

(65) Prior Publication Data

US 2001/0036680 A1 Nov. 1, 2001

(30) Foreign Application Priority Data

Apr. 28, 2000 (JP) ........................................ 2000-129661
Jun. 2, 2000 (JP) ........................................ 2000-165516

(51) Int. Cl.[7] .............................................. H01L 21/00
(52) U.S. Cl. ........................................ 438/149; 438/30
(58) Field of Search ................................... 438/30, 169

(56) References Cited

U.S. PATENT DOCUMENTS 5,621,556 A * 4/1997 Fulks et al. .................... 349/42
6,078,366 A * 6/2000 Dotno et al. ................... 257/59
6,184,960 B1 * 2/2001 Sawayama et al. ........... 257/59

* cited by examiner

*Primary Examiner*—Jey Tsai
(74) *Attorney, Agent, or Firm*—Frishauf, Holtz, Goodman & Chick, P.C.

(57) ABSTRACT

A protective film for protecting the channel region of a thin film transistor is formed by a dry etching treatment. Therefore, even if there is a defect in a semiconductor film, pin holes are not formed in a gate insulating film. It follows that the breakdown voltage of the gate insulating film is not lowered even if a scanning signal line, etc., including a gate electrode, are formed of only an Al-based metal film that does not have an anodic oxide film formed on the surface.

19 Claims, 30 Drawing Sheets

METHOD OF MANUFACTURING THIN FILM TRANSISTOR PANEL HAVING PROTECTIVE FILM OF CHANNEL REGION

CROSS-REFERENCE TO RELATED APPLICATIONS

This application is based upon and claims the benefit of priority from the prior Japanese Patent Applications No. 2000-129661, filed Apr. 28, 2000; and No. 2000-165516, filed Jun. 2, 2000, the entire contents of both of which are incorporated herein by reference.

BACKGROUND OF THE INVENTION

1. Field of the Invention

The present invention relates to a method of manufacturing a thin film transistor panel used in, for example, an active matrix type liquid crystal display device, particularly, to a method of manufacturing a thin film transistor panel, which permits lowering the manufacturing cost of a thin film transistor having a protective film of the channel region.

2. Description of the Related Art

In manufacturing a thin film transistor panel applied to an active matrix type liquid crystal display device, a transparent substrate is prepared consisting of, for example, glass and providing the base of the thin film transistor panel. In order to improve productivity, a large transparent substrate having a size corresponding to a plurality of thin film transistor panels is prepared, and the portions corresponding to a plurality of panels are collectively prepared up to a predetermined manufacturing step, followed by dividing the large transparent substrate into individual panels for application of the subsequent manufacturing steps. Also, in the case of manufacturing a thin film transistor panel equipped with a thin film transistor acting as a switching element, an anodic oxide film is formed on the surface of, for example, a gate line (scanning signal line) including the gate electrode of the thin film transistor so as to improve the breakdown voltage. Further, insulation breakdown takes place in the thin film transistor or the voltage-current characteristics of the thin film transistor are changed by static electricity generated when, for example, the oriented film is subjected to a rubbing treatment before the large transparent substrate is divided into the individual panels, or by the divided individual panels contacting another substance charged with a high voltage of, for example, static electricity. Under the circumstances, measures against static electricity are taken.

FIG. 20, which illustrates the prior art, is a plan view showing the equivalent circuit of a thin film transistor panel under the state that pixel electrodes, etc. are formed on a glass substrate having a size corresponding to a plurality of thin film transistor panels. A glass substrate 1 having a size corresponding to a plurality of thin film transistor panels is finally cut along a cut line 2 denoted by a dot-and-dash line so as to be divided into individual panels. In this case, the region surrounded by the cut line 2 forms a panel forming region 3 and the region surrounding the panel forming region 3 forms a panel non-forming region 4. Also, that region of the panel forming region 3 which is surrounded by a two dots-and-dash line forms a display region 5, and the region surrounding the display region 5 forms a non-display region 6.

Arranged within the display region 5 are a plurality of pixel electrodes 7 arranged to form a matrix, a plurality of thin film transistors 8 connected to these pixel electrodes 7, a plurality of scanning signal lines 9 arranged in the row direction for supplying a scanning signal to the thin film transistors 8, a plurality of data signal lines 10 arranged in the column direction for supplying a data signal to the thin film transistors 8, a plurality of auxiliary capacitance lines 11 arranged in the row direction and forming an auxiliary capacitance section Cs between the pixel electrode 7 and the auxiliary capacitance line 11, a protective ring 13 including a jumper line 12 arranged to surround a plurality of the pixel electrodes 7, a plurality of protective elements 14 arranged on the outside of the protective ring 13 and each consisting of two protective thin film transistors arranged to face each other with the scanning signal line 9 interposed therebetween, and a plurality of protective elements 15 arranged on the outside of the protective ring 13 and each consisting of two protective thin film transistors arranged to face each other with the data signal line 10 interposed therebetween. Further, power supply lines 16 are arranged to form a lattice within the panel non-forming region 4.

The left edge portion of each of the scanning signal lines is connected to the power supply line 16 via a connection pad (scanning electrode terminal) 18 on the output side arranged within a semiconductor chip mounting region 17 denoted by a dotted line within the non-display region 6. The upper edge portion of each of the data signal lines 10 is connected to the power supply line 16 via a connection pad (data electrode terminal) 20 on the output side arranged within a semiconductor chip mounting region 19 denoted by a dotted line within the non-display region 6. Connection pads 21, 22 on the input side, which are arranged within the semiconductor chip mounting regions 17, 19, respectively, are connected to external connection terminals 23 formed at predetermined positions within the non-display region 6 via wirings 24. These external connection terminals 23 are connected to the power supply line 16. The left edge portion of each of the auxiliary capacitance lines 11 is connected to the power supply line 16 via a common line 25 and a connection pad 26, which are arranged on the outside of the right side portion of the protective ring 13. Incidentally, the common line 25 is connected to the protective ring 13 in some cases.

The gate electrode G and the source electrode S of the protective thin film transistor on the upper side, which is included in the protective element 14 arranged on the side of the scanning signal line, are connected to the scanning signal line 9, and the drain electrode of the particular protective thin film transistor is connected to the protective line 13. On the other hand, the gate electrode G and the source electrode S of the lower protective thin film transistor, which is included in the protective element 14 on the side of the scanning signal line, are connected to the protective ring 13, and the drain electrode D of the particular thin film transistor is connected to the scanning signal line 9. Further, the gate electrode G and the source electrode S of the protective thin film transistor on the left side, which is included in the protective circuit 15 on the side of the data signal line, are connected to the protective ring 13, and the drain electrode D of the particular thin film transistor is connected to the data signal line 10. Still further, the gate electrode G and the source electrode S of the protective thin film transistor on the right side, which is included in the protective element 15 arranged on the side of the data signal line, are connected to the data signal line 10, and the drain electrode D of the particular thin film transistor is connected to the protective ring 13.

The method of manufacture of a thin film transistor panel of the construction described above will now be described with reference to FIG. 21. In the first layer forming step S1 shown in FIG. 21, an Al-based metal film (not shown) such as an Al film or an Al alloy film is formed on the upper surface of a glass substrate. Then, in the first photoresist forming step S2 shown in FIG. 21, a first photoresist film is formed on the upper surface of the Al-based metal film. Further, in the scanning signal line forming step S3 shown in FIG. 21, the Al-based metal film is etched with the first photoresist film used as a mask, followed by peeling off the first resist film.

As a result, formed on the upper surface of the glass substrate 1 are the gate electrode G of the thin film transistor, the scanning signal line 9, the auxiliary capacitance line 11, a lower protective ring 13a, and a lower layer connection pad 18, each consisting of the Al-based metal film, as shown in FIG. 22. Incidentally, the "lower protective ring 13a" noted above represents the upper side portion, the lower side portion and the right side portion of the protective ring 13 shown in FIG. 20. Also formed are the power supply line 16, the connection pads 21, 22, the external connection terminal 23, the wiring 24, the common line 25, the connection pad 26, etc. Incidentally, the protective thin film transistors included in each of the protective elements 14 and 15 are formed in substantially the same manner as in the formation of the thin film transistor 8 and, thus, the description is omitted in respect of the formation of the protective thin film transistors noted above.

Then, in the second photoresist forming step S4 shown in FIG. 21, a second photoresist film 29a is formed on the lower layer connection pad 18a, and a second photoresist film 29b is formed on the connecting portion of the lower protective ring 13a at which the lower protective portion 13a is connected to the jumper line 12 shown in FIG. 20, as shown in FIG. 22. Further, in the anodic oxidation step S5 shown in FIG. 21, one electrode of the power supply line 16 shown in FIG. 20 is subjected to an anodic oxidation so as to form an anodic oxide film 30 on the surfaces of the gate electrode G of the thin film transistor 8, the scanning signal line 9, the auxiliary capacitance line 11, etc. as shown in FIG. 23. In this case, an anodic oxide film is not formed on the surfaces of the lower layer connection pad 18a and the connecting portion of the lower portion protective ring 13a, which are covered with the second photoresist films 29a, 29b, respectively. Then, the second photoresist films 29a, 29b are peeled off.

Then, in the three layers forming step S6 shown in FIG. 21, a gate insulating film 31 consisting of silicon nitride, a semiconductor film 32 consisting of an intrinsic amorphous silicon, and a protective film-forming film 33 consisting of silicon nitride are successively formed as shown in FIG. 24. Further, in the third photoresist forming step S7 shown in FIG. 21, the upper surface of the protective film-forming film 33 is coated with a third photoresist film, followed by applying a light exposure from the back surface with the gate electrode G, etc. used as a mask. At the same time, a light exposure is also applied from the front surface by using a photomask (not shown). Then, a developing treatment is applied. As a result, a third photoresist film 34a is formed on the upper surface of the protective film-forming film 33 on the gate electrode G of the thin film transistor 8, as shown in FIG. 24. Also, a photoresist film 34b is formed on the upper surface of the protective film-forming film 33 in the crossing region of the lines 9 and 10.

Then, in the protective film forming step S8 shown in FIG. 21, the protective film-forming film 33 is subjected to a wet etching with the third photoresist films 34a, 34b used as a mask. As a result, protective films 33a, 33b are formed below the third photoresist films 34a, 34b, respectively, as shown in FIG. 25. Then, the third photoresist films 34a, 34b are peeled off. In this case, the protective film 33b serves to improve the breakdown voltage in the crossing region of the lines 9 and 10. Also, the protective film 33a serves to protect the channel region of the semiconductor film 32. The protective film 33a will be described in detail herein later in conjunction with the manufacturing process of the thin film transistor.

Where semiconductor film 32 has defects such as pin holes when the protective film-forming film 33 is subjected to a wet etching, the etchant permeates into the semiconductor film 32 so as to arrive at the gate insulating film 31, with the result that pin holes are formed in the gate insulating film 31, or the semiconductor film 32 is damaged. However, since the anodic oxide film 30 is formed on the surface of the scanning signal line 9, etc. including the gate electrode G, a short circuit between the gate electrode 30 and the source electrode S or between the gate electrode 30 and the drain electrode D is prevented. It is also possible to prevent the breakdown voltage of the gate insulating film 31 from being substantially lowered.

Then, in the n-type amorphous silicon film forming step S9 shown in FIG. 21, an n-type amorphous silicon film 35 is formed as shown in FIG. 26. Further, in the three conductive layers forming step S10 shown in FIG. 21, a Cr film 36, an Al-based metal film 37, and a Cr film 38 are successively formed as shown in FIG. 26.

In the subsequent step of the fourth photoresist forming step S11 shown in FIG. 21, fourth photoresist films 39a to 39d are formed in predetermined positions on the upper surface of the upper Cr film 38, as shown in FIG. 26. In this case, the fourth photoresist films 39a and 39b are for forming the drain electrode D and the source electrode S, respectively, of the thin film transistor 8. The third photoresist film 39c is for forming the data signal line 10 and the lower layer connection pad. Further, the fourth photoresist film 39d is for forming the remaining portion of the protective ring 13, i.e., for forming the left side portion of the protective ring 13 shown in FIG. 20.

Then, in step S12 for forming the data signal line, etc. shown in FIG. 21, the Cr film 38, the Al-based metal film 37 and the Cr film 36 are etched with the fourth photoresist films 39a to 39d used as a mask. Further, in the device area forming step S13 shown in FIG. 21, the n-type amorphous silicon film 35 and the semiconductor film 32 are etched with the fourth photoresist films 39a to 39d used as a mask.

As a result, the data signal line 10 and the lower layer connection pad 20a are formed as shown in FIG. 27. In this case, each of the data signal line 10 and the lower layer connection pad 20 is of a laminate structure consisting of the semiconductor film 32, the n-type amorphous silicon film 35, the Cr film 36, the Al-based metal film 37 and the Cr film 38, which are laminated in the order mentioned as viewed from below.

Also, in the region of forming the thin film transistor 8, etc., a semiconductor film 32a is formed in a predetermined position on the upper surface of the gate insulating film 31. Also, the drain electrode D and the source electrode S are formed on both sides above the upper surface of the protective film 33a and on both sides above the semiconductor film 32a. In this case, each of the drain electrode D and the source electrode S is of a laminate structure consisting of the n-type amorphous silicon film 35, the Cr film 36, the Al-based metal film 37 and the Cr film 38, which are laminated in the order mentioned as viewed from below. It should be noted that the protective film 33a serves to prevent the semiconductor film 32a, made of amorphous silicon, from being etched in the step of etching the n-type amorphous silicon film 35 on the channel region of the thin film transistor 8. As a result, the characteristics of the thin film transistor are prevented from being deteriorated.

Further, a remaining portion 13b of the protective ring 13, i.e., the left side portion of the protective ring 13 shown in FIG. 20, is formed. In this case, the remaining portion 13b of the protective ring 13, which is herein after referred to as the "upper portion protective ring 13", is of a laminate structure consisting of the semiconductor film 32, the n-type amorphous silicon film 35, the Cr film 36, the Al-based metal film 37 and the Cr film 38, which are laminated in the order mentioned as viewed from below. Then, the fourth photoresist films 39a to 39d are peeled off.

Then, in the overcoat film forming step S14 shown in FIG. 21, an overcoat film 41 (see FIG. 28) consisting of silicon nitride is formed. Further, in the fifth photoresist forming step S15 shown in FIG. 21, a fifth photoresist film (not shown) is formed on the upper surface of an overcoat film (upper insulating film) 41. Still further, in the contact hole forming step S16 shown in FIG. 21, contact holes are made in predetermined positions of the overcoat film 41 and the gate insulating film 31 with the fifth photoresist film used as a mask, followed by peeling off the fifth photoresist film.

As a result, in the region for forming the thin film transistor 8, etc., a contact hole 42 is formed in that region of the overcoat film 41 which corresponds to the source electrode S, as shown in FIG. 28. On the other hand, in the region for forming the jumper line 12 of the protective ring 13, a contact hole 43 is formed in those portions of the overcoat film 41 and the gate insulating film 31 which correspond to the connecting portion of the lower portion protective ring 13a. Also, a contact hole 44 is formed in that portion of the overcoat film 41 which corresponds to the connecting portion of the upper portion protective ring 13b. Further, in the region for forming the connection pad 20, a contact hole 45 is formed in that portion of the overcoat film 41 which corresponds to the lower layer connection pad 20a. Still further, in the region for forming the connection pad 18, a contact hole 46 is formed in those portions of the overcoat film 41 and the gate insulating film 31 which correspond to the lower layer connection pad 18a.

Then, in the ITO (Indium Tin Oxide) film forming step S17 shown in FIG. 21, an ITO film 47 is formed as shown in FIG. 29. Further, in the sixth photoresist forming step S18 shown in FIG. 21, sixth photoresist films 48a to 48d are formed in predetermined positions on the upper surface of the ITO film 47, as shown in FIG. 29. In this case, the sixth photoresist film 48a is for forming the pixel electrode 7. The sixth photoresist film 48b is for forming the jumper line 12 of the protective ring 13. Further, the sixth photoresist films 48c and 48d are for forming the upper layer connection pad.

Then, in step S19 for forming the pixel electrode, etc. shown in FIG. 21, the ITO film 47 is etched with the sixth photoresist films 48a to 48d used as a mask, followed by peeling off the sixth photoresist films 48a to 48d. As a result, in the region for forming the thin film transistor 8, etc., the pixel electrode 7 consisting of the ITO film is formed in a predetermined position on the upper surface of the overcoat film 41 in a manner to be connected to the source electrode S via the contact hole 42, as shown in FIG. 30. Also, in the region for forming the jumper line 12 of the protective ring 13, a jumper line 12 consisting of the ITO film is formed in a predetermined position on the upper surface of the over- coat film 41. In this case, one end portion of the jumper line 12 is connected to the lower portion protective ring 13a via the contact hole 43, and the other end portion of the jumper line 12 is connected to the upper portion protective ring 13b via the contact hole 44.

Also, in the region for forming the connection pad 20, the upper layer connection pad 20b consisting of the ITO film is formed in a predetermined position on the upper surface of the overcoat film 41 in a manner to be connected to the lower layer connection pad 20a via the contact hole 45. Further, in the region for forming the connection pad 18, the upper layer connection pad 18b consisting of the ITO film is formed in a predetermined position on the upper surface of the overcoat film 41 in a manner to be connected to the lower layer connection pad 18a via the contact hole 46. In this case, if the connection pad 18 is formed of only the lower layer connection pad 18a consisting of the Al-based metal layer, the surface of the connection pad 18 is exposed to the outside in the contact hole 46 so as to be oxidized. In the present invention, however, such a problem is not generated because the upper layer connection pad 18b consisting of the ITO film is formed on the surface of the lower layer connection pad 18a. The thin film transistor panel as shown in FIG. 20 is obtained by the steps described above. In the thin film transistor panel thus obtained, the ITO film constituting the pixel electrode 7 is positioned on the top side of the thin film transistor 8 and, thus, is called a TOP-ITO structure in some cases.

It should be noted that, in manufacturing the thin film transistor panel, static electricity is generated when, for example, the oriented film is subjected to a rubbing treatment before the panel is cut along the cut line 2. However, since all the wirings within the panel forming region 3 are connected to the power supply line 16 within the panel non-forming region 4, the generated static electricity can be removed promptly if the power supply line 16 is grounded.

After the thin film transistor panel is cut along the cut line 2 in the manufacturing process of the thin film transistor panel, it is possible for the cut panel to be brought into contact with another substance charged with static electricity. In this case, the protective ring 13, all the scanning signal lines 9 and all the data signal lines 10 can be allowed to bear the same potential by turning on appropriately the protective thin film transistors included in the protective elements 14 and 15. Incidentally, the protective thin film transistors included in the protective elements 14 and 15 do not adversely effect the normal display drive of the liquid crystal display device equipped with the thin film transistor panel.

Problems to be Solved by the Invention

In the conventional manufacturing method of the thin film transistor panel described above, particularly, in the second photoresist forming step S4 and the anodic oxidation step S5 shown in FIG. 21, the second photoresist films 29a, 29b are formed, subjected to the anodic oxidation treatment and, then, the second photoresist films 29a, 29b are peeled off, giving rise to the problem that the number of manufacturing steps is increased.

It should also be noted that, if the connection pad 18 is formed by arranging the upper layer connection pad 18b consisting of the ITO film on the lower layer connection pad 18a consisting of the Al-based metal film as shown in FIG. 30, the contact characteristics between the Al-based metal film and the ITO film are rendered poor. If the ITO film on the lower layer connection pad 18a consisting of the Al-based metal film is removed in order to overcome the above-noted problem, the exposed Al-based metal film is dissolved in the etchant of the ITO film. Also, if the Al-based film is in contact with the ITO film, the Al-based metal film is oxidized by the etchant of the ITO film, with the result that the ITO film is reduced, giving rise to the problem that both the Al-based metal film and the ITO film are corroded by the so-called "cell reaction".

BRIEF SUMMARY OF THE INVENTION

An object of the present invention is to provide a method of manufacturing a thin film transistor panel, which permits decreasing the number of manufacturing steps and also permits preventing the occurrence of the cell reaction so as to improve the contact characteristics with the connection pad.

According to the present invention, there is provided a method of manufacturing a thin film transistor panel, comprising the steps of forming a scanning signal line including a connection pad and a gate electrode section, the entire region of which includes the surface, being formed of a conductive metal film, on a substrate, forming a gate insulating film on the substrate and the scanning signal line, forming a semiconductor film on the gate insulating film, forming a protective film-forming film on the semiconductor film, patterning the protective film-forming film by a dry etching so as to form a protective film in that region of the semiconductor film which corresponds to the gate electrode section, forming a drain electrode connected to one region of the semiconductor film exposed to the outside from both sides of the protective film and forming a source electrode connected to the other region, forming an upper insulating film to cover the drain electrode, the source electrode and the gate insulating film, and forming a transparent electrode connected to the source electrode on the upper insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the Invention (First Embodiment)

Figure 1:
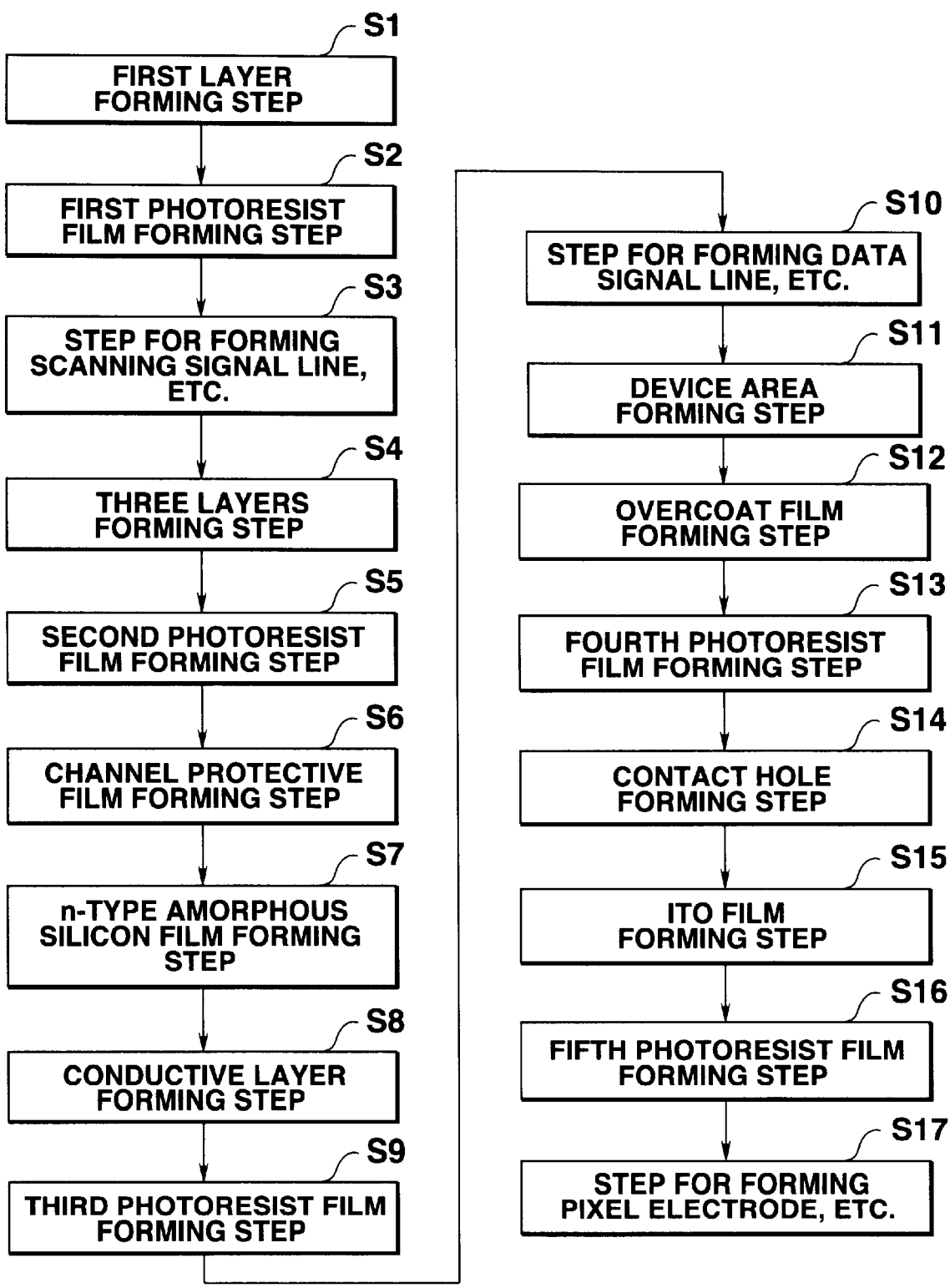
FIG. 1 is a flow chart showing the manufacturing process of a thin film transistor panel according to a first embodiment of the present invention.
Figure 2:
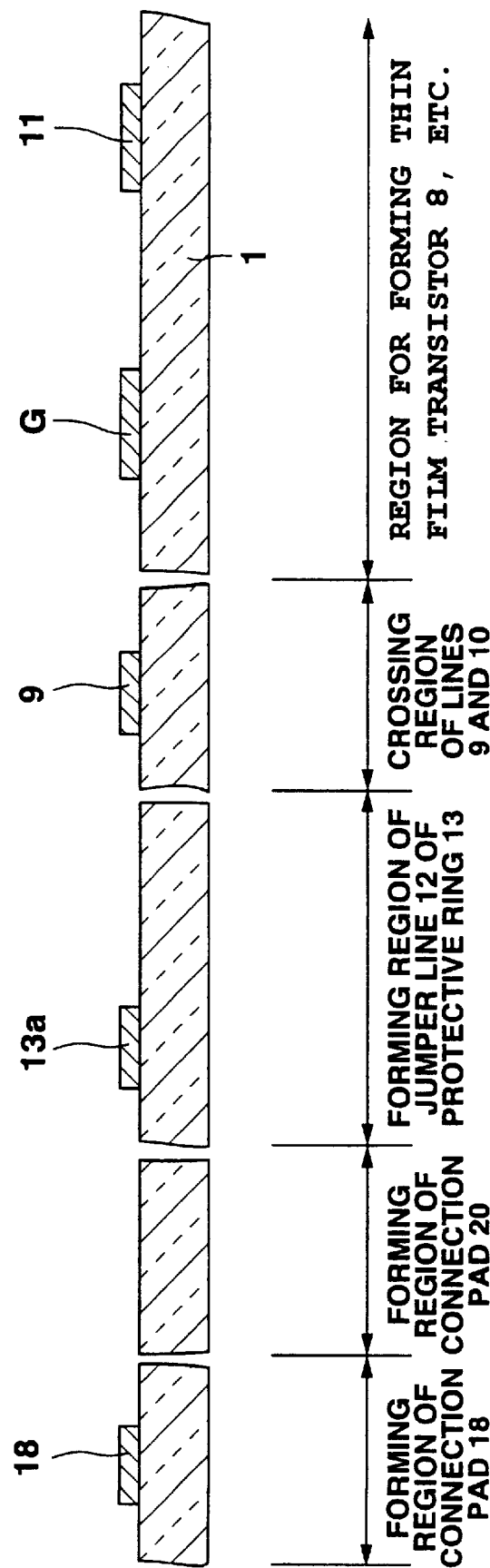
FIG. 2 is a cross sectional view showing a magnified portion of a thin film transistor panel for explaining the initial step of the manufacturing process of the thin film transistor panel shown in FIG. 1.

FIG. 1 is a flow chart showing the manufacturing process of a thin film transistor panel applied to an active matrix type liquid crystal display device according to a first embodiment of the present invention, and FIGS. 2 to 9 are cross sectional views each showing a magnified portion of the thin film transistor panel in the manufacturing process of the thin film transistor panel. Incidentally, the plan view showing the equivalent circuit under the state that the pixel electrodes, etc. are formed on a glass substrate having a size corresponding to a plurality of thin film transistor panels according to the first embodiment is equal to that for the conventional case shown in FIG. 20 and, thus, the same reference numerals as those in FIG. 20, etc. are used in FIGS. 2 to 9 in respect of the corresponding members of the thin film transistor panel for facilitating the description.

In manufacturing a thin film transistor panel according to the first embodiment of the present invention, an Al-based metal film, i.e., a low resistance conductive metal film, (not shown) consisting of, for example, an Al film or an Al alloy film is formed on the surface of a glass substrate in the first layer forming step S1 shown in FIG. 1. Then, in the first photoresist forming step S2 shown in FIG. 1, a first photoresist film is formed on the upper surface of the Al-based metal film. Further, in the scanning signal line forming step S3 shown in FIG. 1, the Al-based metal film is etched with the first photoresist film used as a mask, followed by peeling off the first photoresist film.

As a result, formed on the upper surface of the glass substrate 1 are the gate electrode G of the thin film transistor 8, the scanning signal line 9, the auxiliary capacitance line 11, the upper portion protective ring 13a of the protective ring 13, and the connection pad (scanning electrode terminal) 18 each consisting of the Al-based metal film. The upper portion protective ring 13a noted above refers to the upper side portion, the lower side portion, and the right side portion of the protective ring 13 shown in FIG. 20. Also formed are the power supply line 16, the connection pads 21, 22, the external connection terminal 23, the wiring 24, the common line 25, the connection pad 26, etc. Incidentally, the formation of the protective thin film transistors included in the protective elements 14, 15 are equal to the formation of the thin film transistor 8 and, thus, the description is omitted in respect of the formation of the protective thin film transistors noted above.

Figure 3:
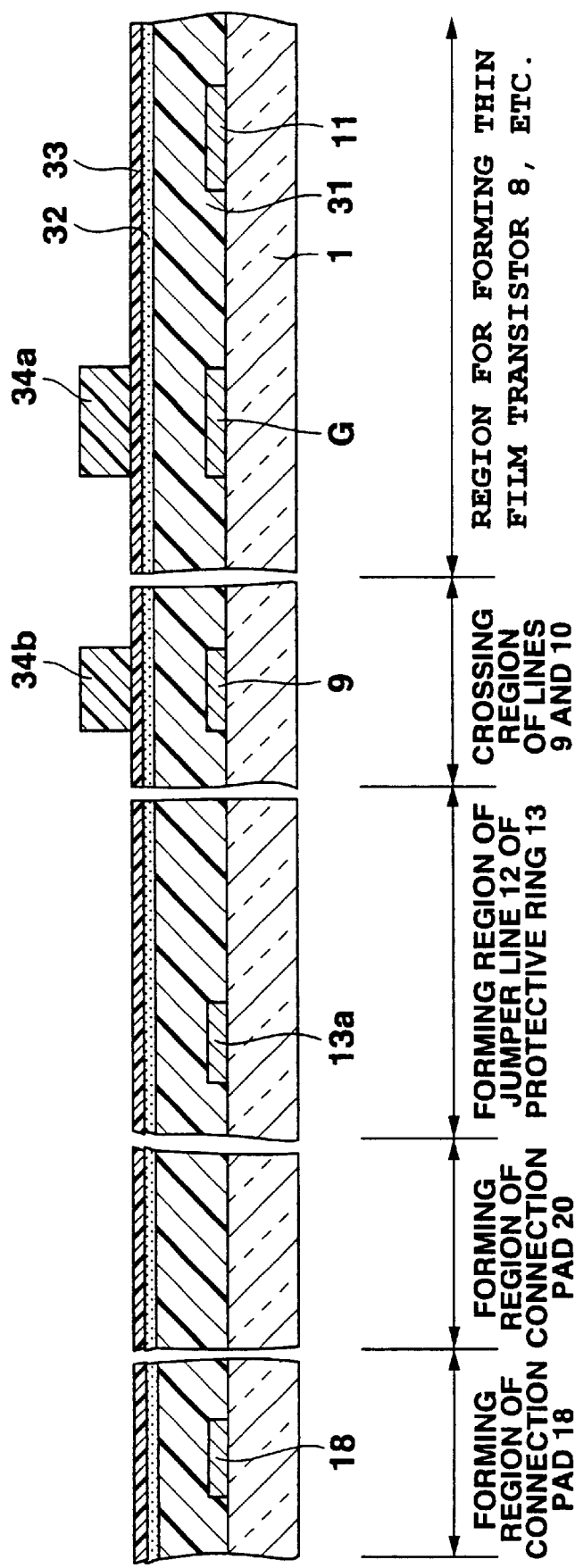
FIG. 3 is a cross sectional view showing a magnified portion of the thin film transistor panel for explaining the step following the step shown in FIG. 2.

Then, in the three layers forming step S4 shown in FIG. 1, the gate insulating film 31 consisting of silicon nitride, the semiconductor layer 32 consisting of an intrinsic amorphous silicon, and the protective film-forming film 33 consisting of silicon nitride are successively formed, as shown in FIG. 3. Further, in the second photoresist forming step S5 shown in FIG. 1, the upper surface of the protective film-forming film 33 is coated with a second photoresist film, followed by exposing light onto the back surface with the gate electrode G, etc. used as a mask. In this step, light is also exposed to the front surface by using a photomask (not shown). Then, a developing treatment is applied. As a result, the second photoresist film 34a is formed on the upper surface of the protective film-forming film 33 on the gate electrode G of the thin film transistor 8, as shown in FIG. 3. Also, the second photoresist film 34b is formed on the upper surface of the protective film-forming film 33 in the crossing region of lines 9 and 10.

Figure 4:
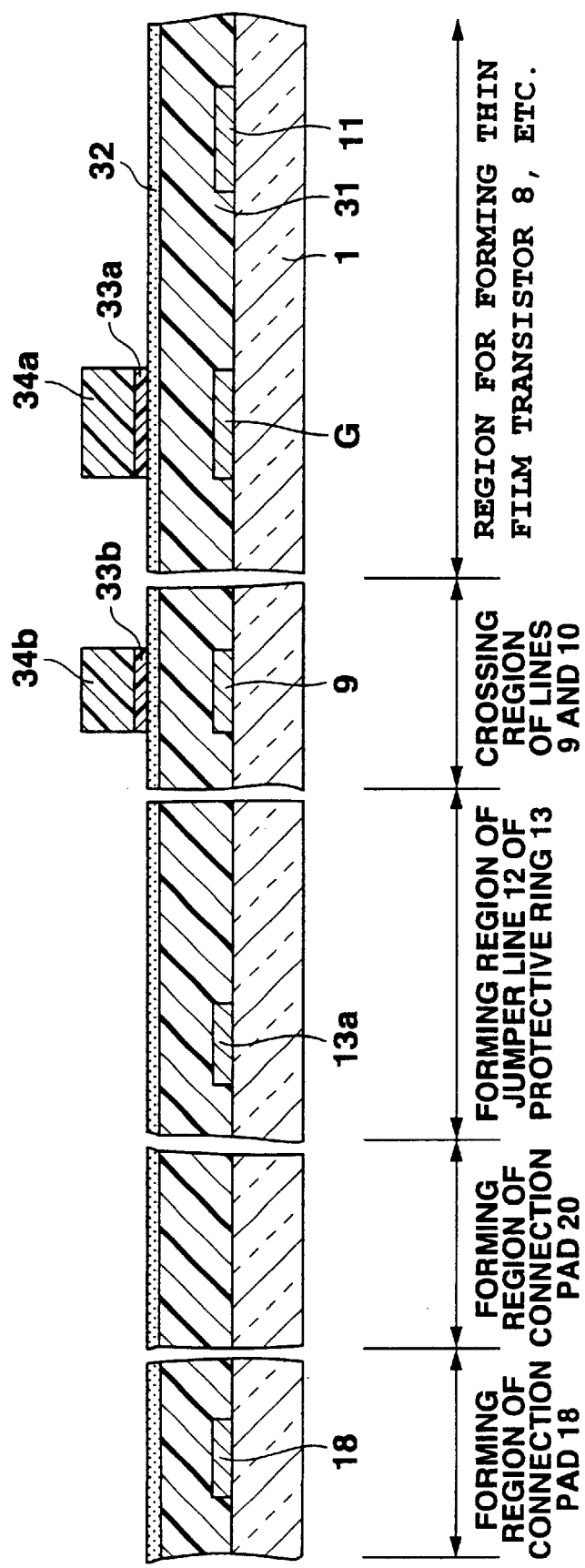
FIG. 4 is a cross sectional view showing a magnified portion of the thin film transistor panel for explaining the step following the step shown in FIG. 3.

Then, in the protective film forming step S6 shown in FIG. 1, the protective film-forming film 33 is subjected to a dry etching with the second photoresist films 34a, 34b used as a mask. It is desirable for the dry etching treatment to be performed by a reactive ion etching method using, for example, a combination of $SF_6$ and He or another combination of $CF_4$ and $O_2$. By this dry etching, the protective films 33a, 33b are formed below the second photoresist films 34a, 34b, respectively, as shown in FIG. 4. In this case, damage is not caused to the gate insulating film 31 even if there are defects such as pin holes in the semiconductor film 32 because the protective films 33a, 33b are formed by the dry etching. To be more specific, if there is a defect such as a pin hole in the semiconductor film 32, a problem is brought about in the case of patterning the protective film-forming film 33 consisting of a silicon nitride film by a wet etching using an etchant. Specifically, the etchant permeates through the defective portion of the semiconductor film 32 so as to reach the gate insulating film 31 consisting of a silicon nitride film, thereby etching the gate insulating film. As a result, pin holes reaching the gate electrode G are formed in the gate insulating film 31, which cause an inconvenience. For example, a short circuit is generated between the gate electrode G and the source electrode S or between the gate electrode G and the drain electrode D. Also, the breakdown voltage of the gate insulating film 31 is lowered. In the first embodiment of the present invention, however, it is possible to prevent the above-noted inconveniences because the protective film-forming film 33 is patterned by a dry etching method. It follows that it is possible to prevent the breakdown voltage of the insulating film 31 from being lowered even if the scanning signal line 9, etc. including the gate electrode G are formed of only the Al-based metal film that does not have an anodic oxide film formed on the surface. It should be noted that the protective film 33b is for improving the breakdown voltage in the intersect region of lines 9 and 10. Then, the second photoresist films 34a, 34b are peeled off.

Figure 5:
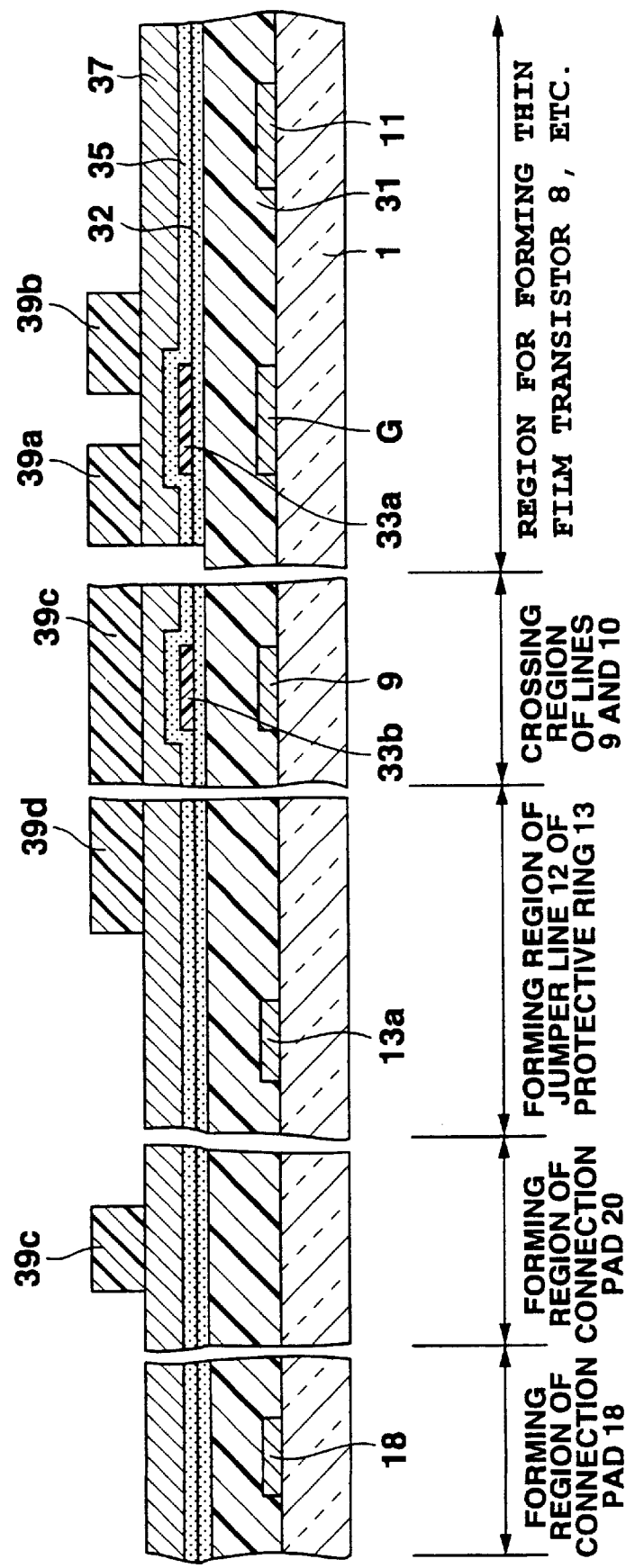
FIG. 5 is a cross sectional view showing a magnified portion of the thin film transistor panel for explaining the step following the step shown in FIG. 4.

In the n-type amorphous silicon film forming step S7 shown in FIG. 1, an n-type amorphous silicon film 35 is formed as shown in FIG. 5. Further, in the conductive layer forming step S8 shown in FIG. 1, the metal film 37 consisting of Cr, Mo, Ta, etc., which has a redox potential higher than that of Al, is formed as shown in FIG. 5. Still further, in the third photoresist forming step S9 shown in FIG. 1, the third photoresist films 39a to 39d are formed in predetermined positions on the upper surface of the metal film 37, as shown in FIG. 5. In this case, the third photoresist films 39a and 39b are for forming, for example, the drain electrode D and the source electrode S of the thin film transistor 8. The third photoresist film 39c is for forming the data signal line 10 and the lower layer connection pad. Further, the third photoresist film 39d is for forming the remaining portion of the protective ring 13, i.e., the left side portion of the protective ring 13 shown in FIG. 20.

Figure 11:
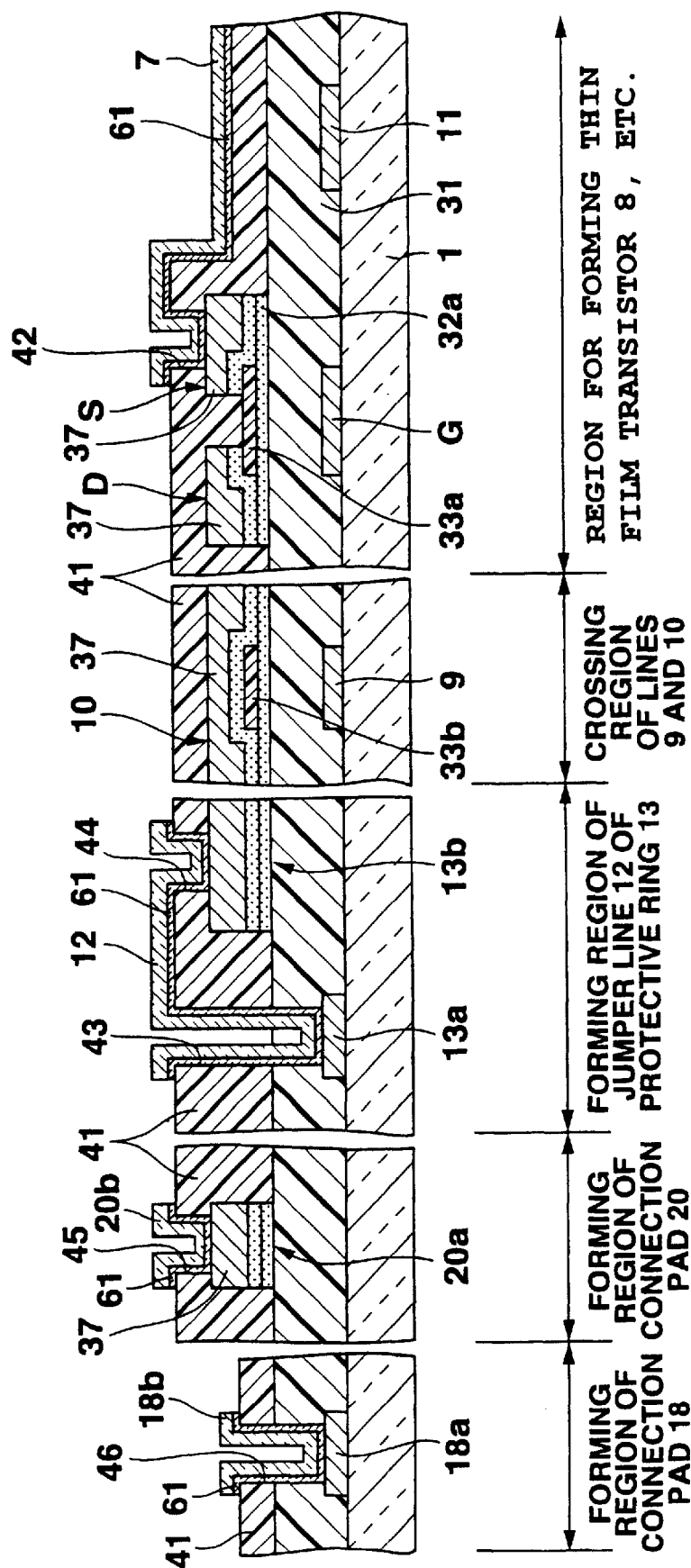
FIG. 11 is a cross sectional view showing a magnified portion of the thin film transistor panel for explaining the step following the step shown in FIG. 10.

Then, in step S10 for forming the data signal line, etc., the metal film 37 is etched with the third photoresist films 39a to 39d used as a mask. Further, in the device area forming step S11 shown in FIG. 11, the n-type amorphous silicon film 35 and the semiconductor film 32 are etched with the third photoresist films 39a to 39d used as a mask.

Figure 6:
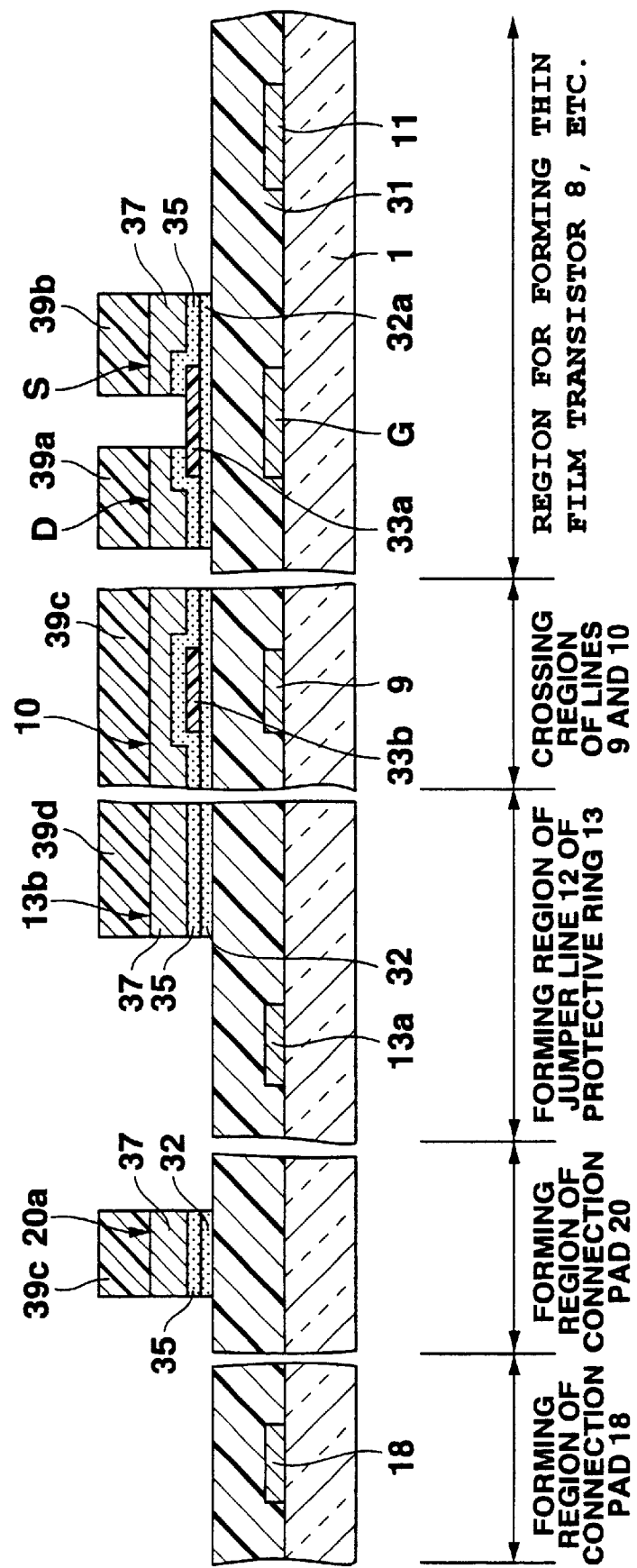
FIG. 6 is a cross sectional view showing a magnified portion of the thin film transistor panel for explaining the step following the step shown in FIG. 5.

As a result, the data signal line 10 and the lower layer connection pad 20a are formed as shown in FIG. 6. In this case, each of the data signal line 10 and the lower layer connection pad 20a is of a laminate structure consisting of the semiconductor film 32, the n-type amorphous silicon film 35 and the metal film 37, which are laminated in the order mentioned as viewed from below.

In the region for forming the thin film transistor 8, etc., the semiconductor film 32a is formed in a predetermined position on the upper surface of the gate insulating film 31. Also, the drain electrode D and the source electrode S are formed on both sides above the protective film 33a and on both sides above the semiconductor film 32a. In this case, each of the drain electrode D and the source electrode S is of a laminate structure consisting of the n-type amorphous silicon film 35 and the metal film 37 formed on the n-type amorphous silicon film 35.

Figure 20:
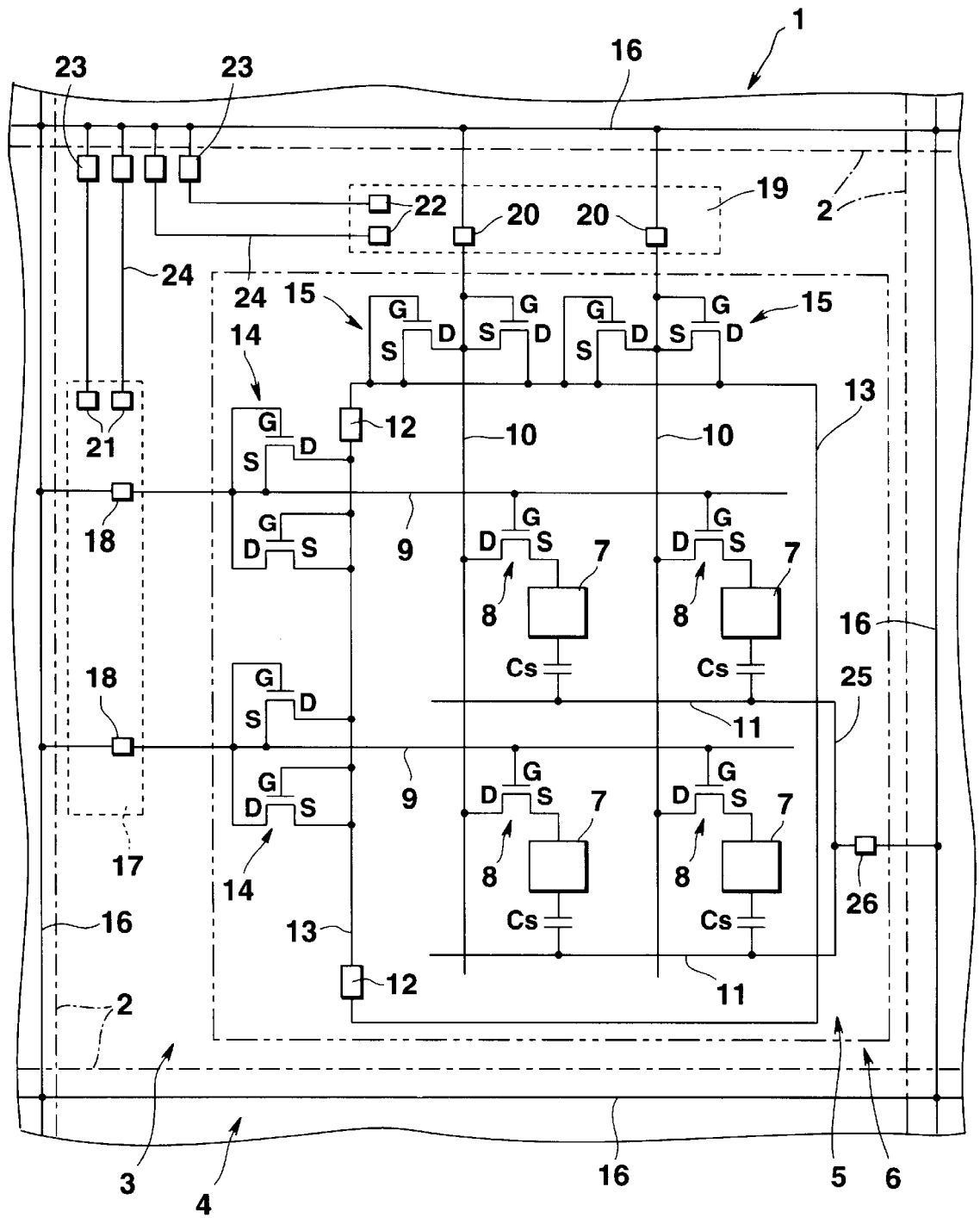
FIG. 20, which is directed to the prior art, is a plan view showing the equivalent circuit under the state that the pixel electrode, etc. are formed on a glass substrate having a size corresponding to a plurality of thin film transistor panels.
Figure 21:
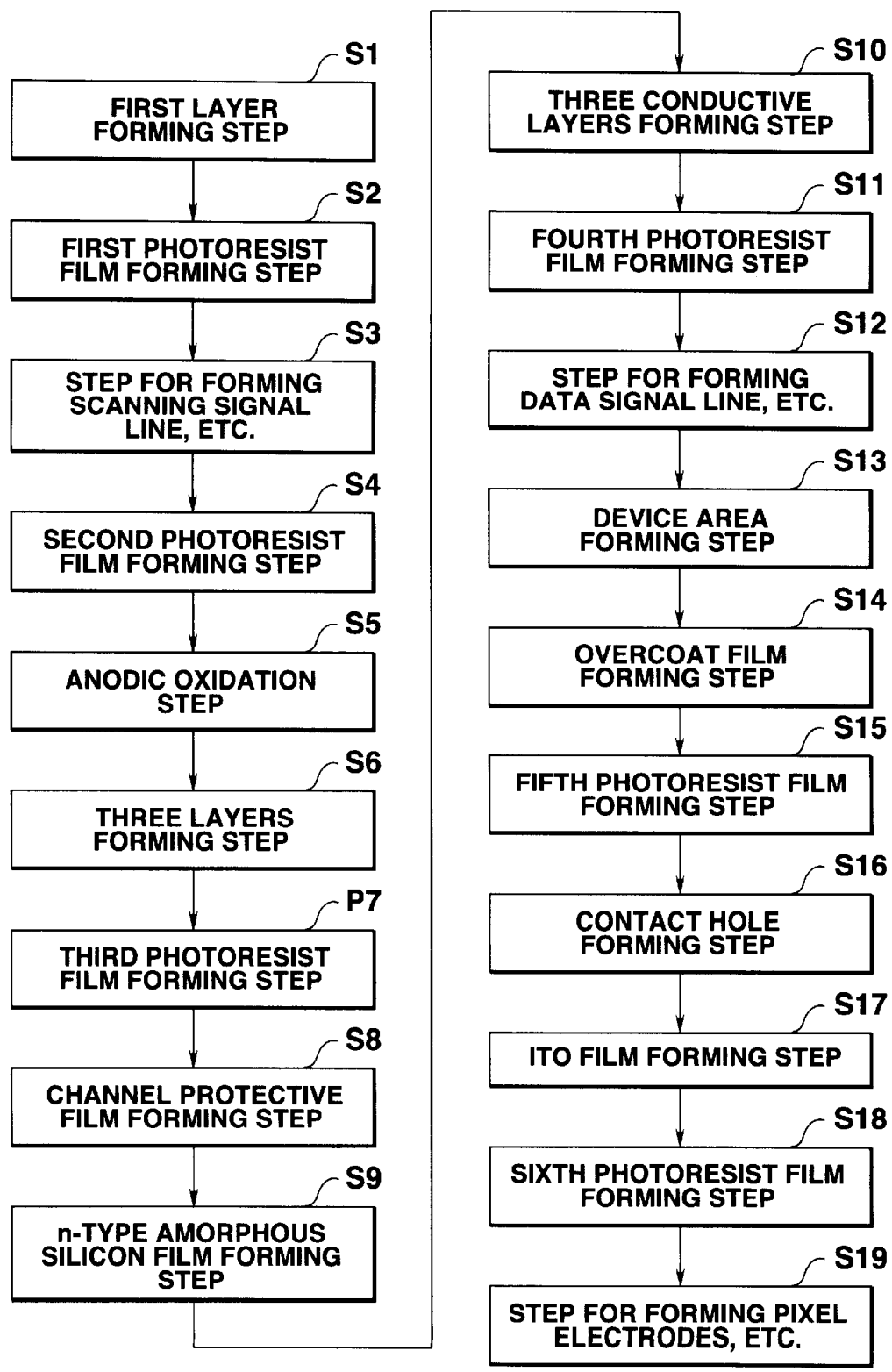
FIG. 21 is a flow chart showing the manufacturing process of the thin film transistor panel shown in FIG. 20.
Figure 22:
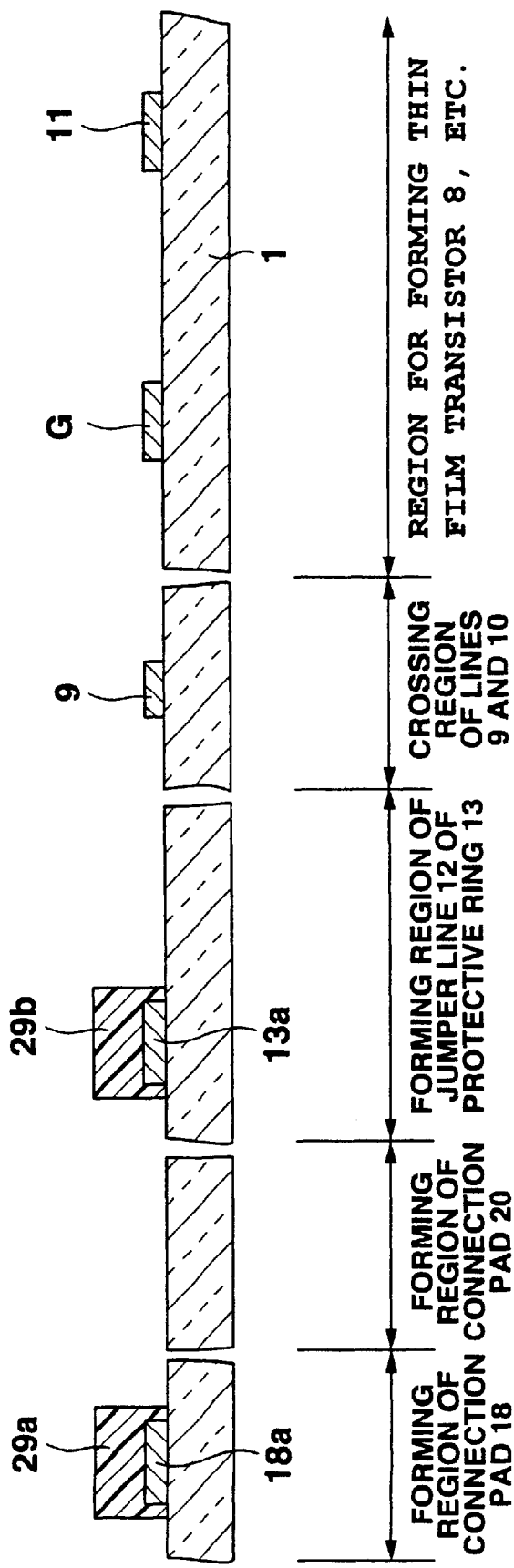
FIG. 22 is a cross sectional view showing a magnified portion of a thin film transistor panel for explaining the initial step of the manufacturing process of the thin film transistor panel shown in FIG. 21.
Figure 23:
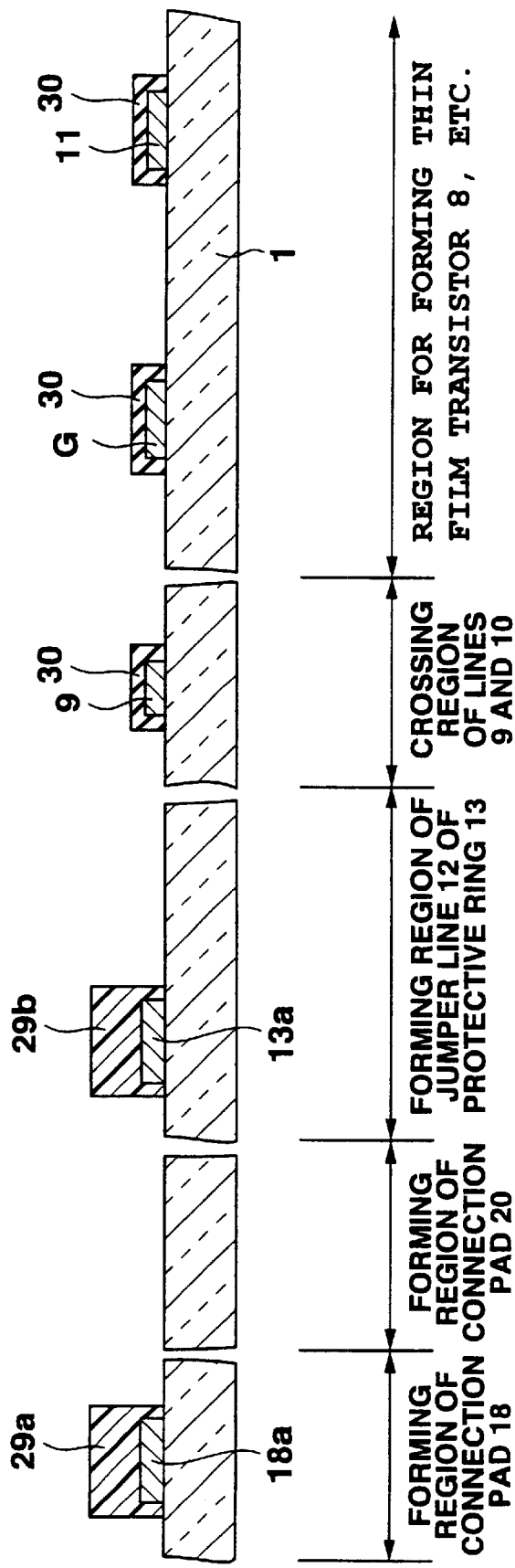
FIG. 23 is a cross sectional view showing a magnified portion of the thin film transistor panel for explaining the step following the step shown in FIG. 22.
Figure 24:
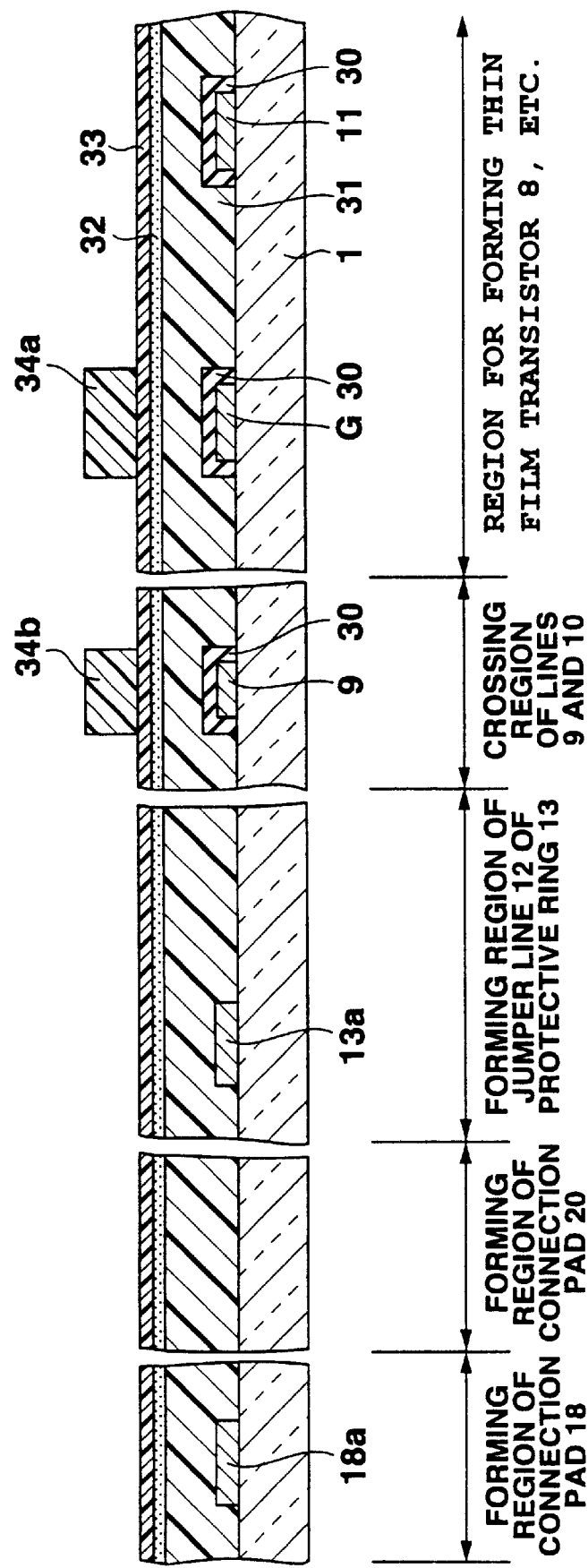
FIG. 24 is a cross sectional view showing a magnified portion of the thin film transistor panel for explaining the step following the step shown in FIG. 23.
Figure 25:
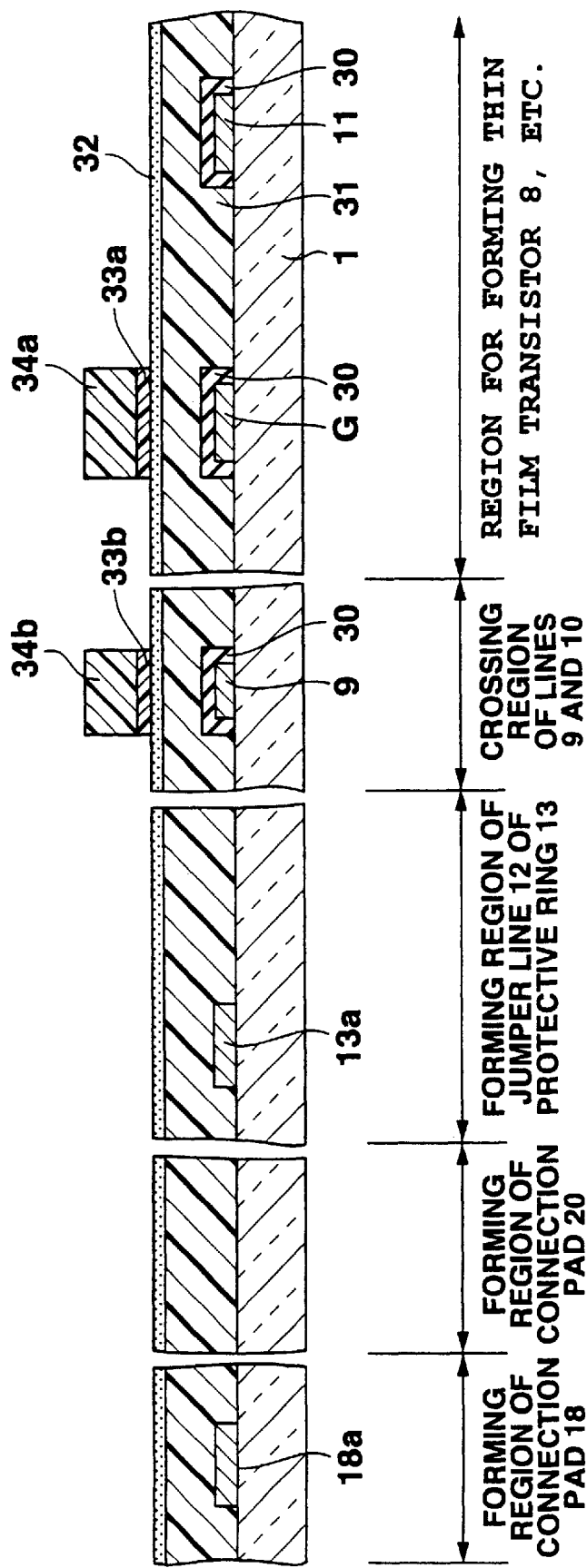
FIG. 25 is a cross sectional view showing a magnified portion of the thin film transistor panel for explaining the step following the step shown in FIG. 24.
Figure 26:
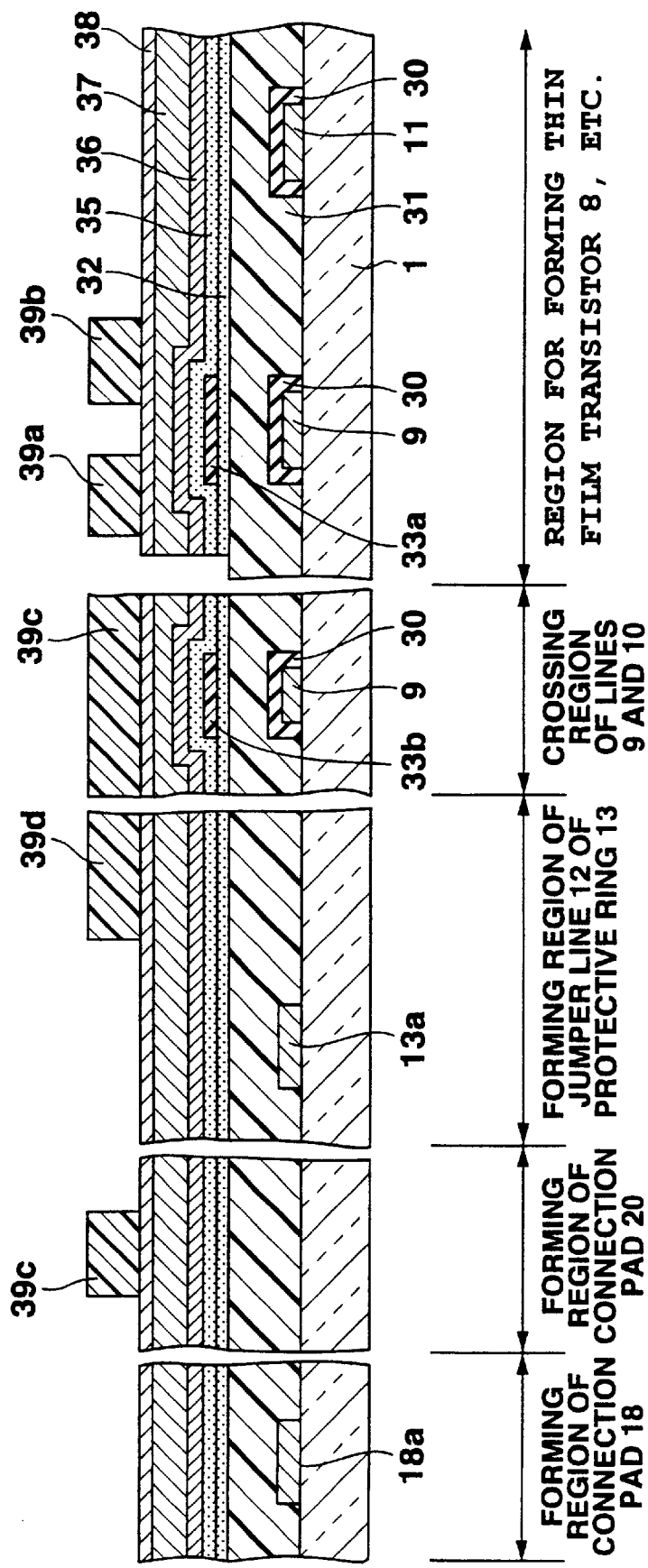
FIG. 26 is a cross sectional view showing a magnified portion of the thin film transistor panel for explaining the step following the step shown in FIG. 25.
Figure 27:
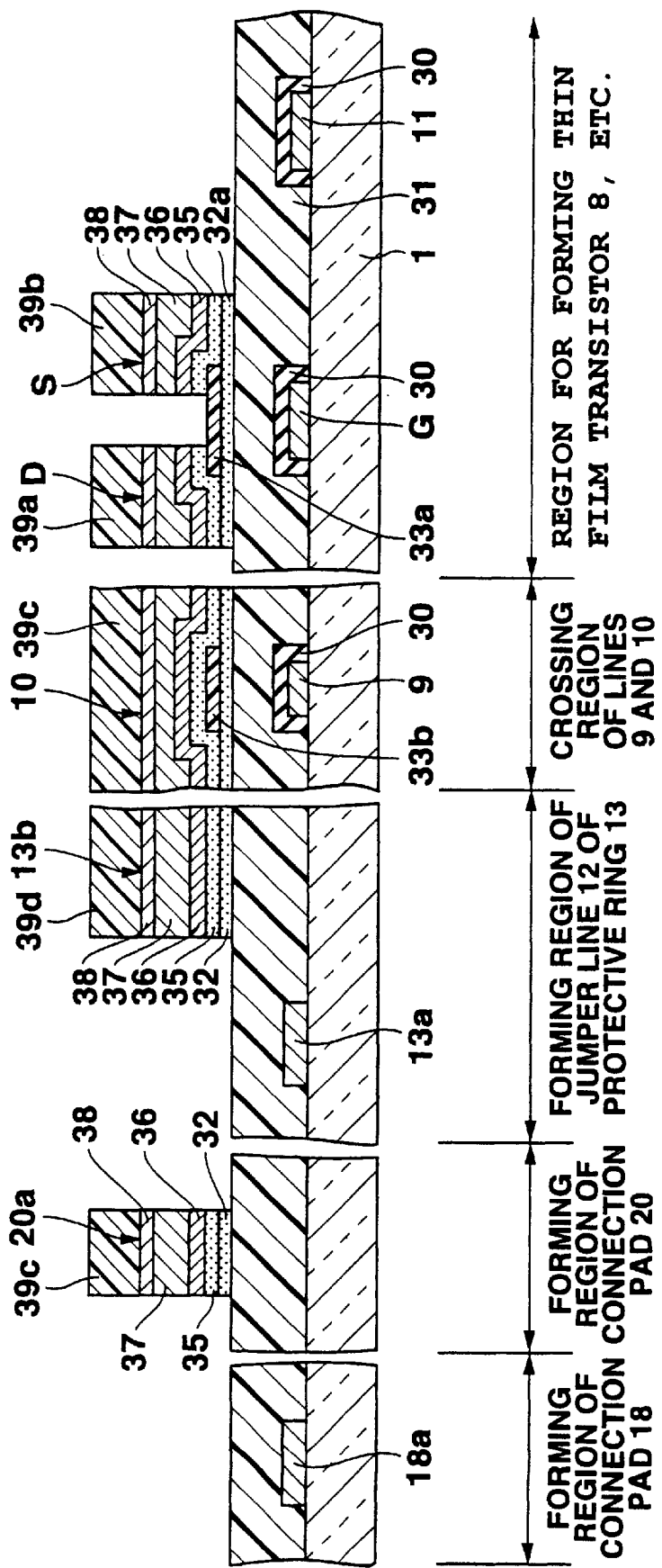
FIG. 27 is a cross sectional view showing a magnified portion of the thin film transistor panel for explaining the step following the step shown in FIG. 26.
Figure 28:
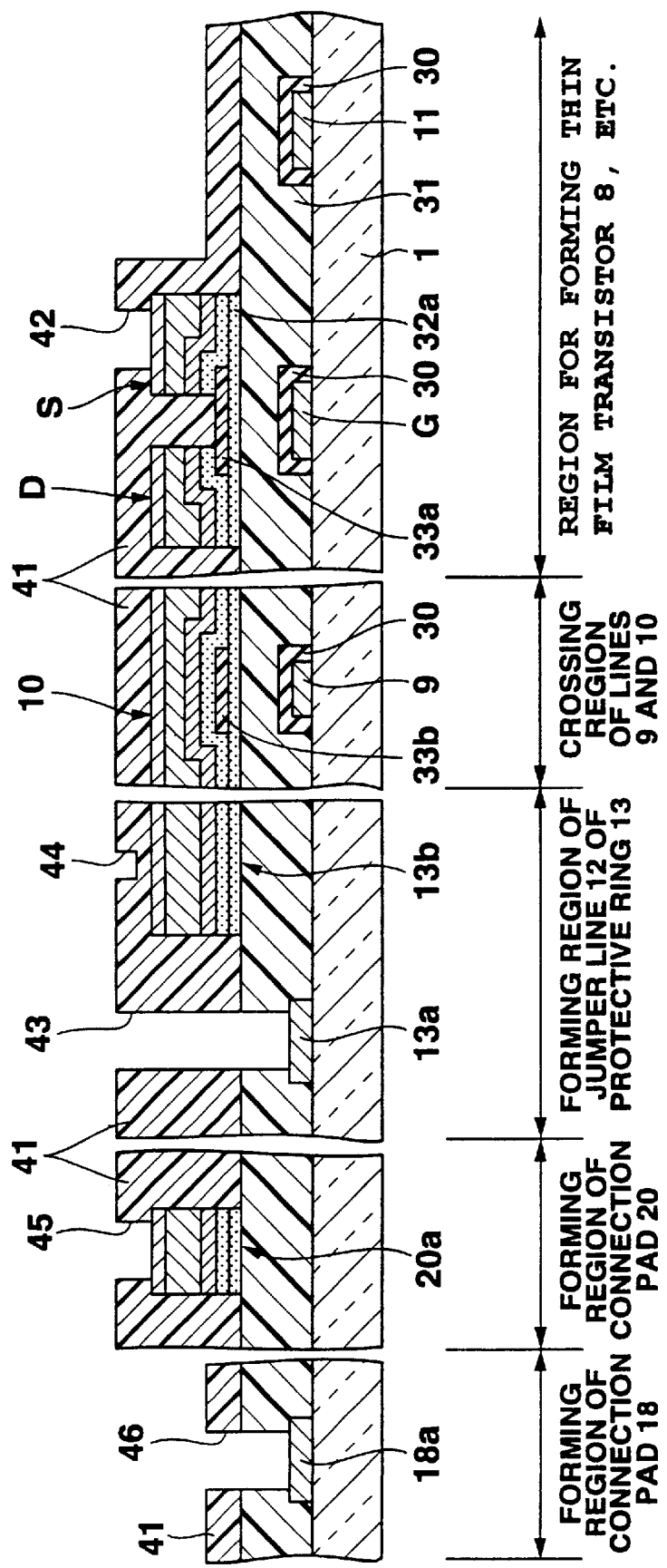
FIG. 28 is a cross sectional view showing a magnified portion of the thin film transistor panel for explaining the step following the step shown in FIG. 27.
Figure 29:
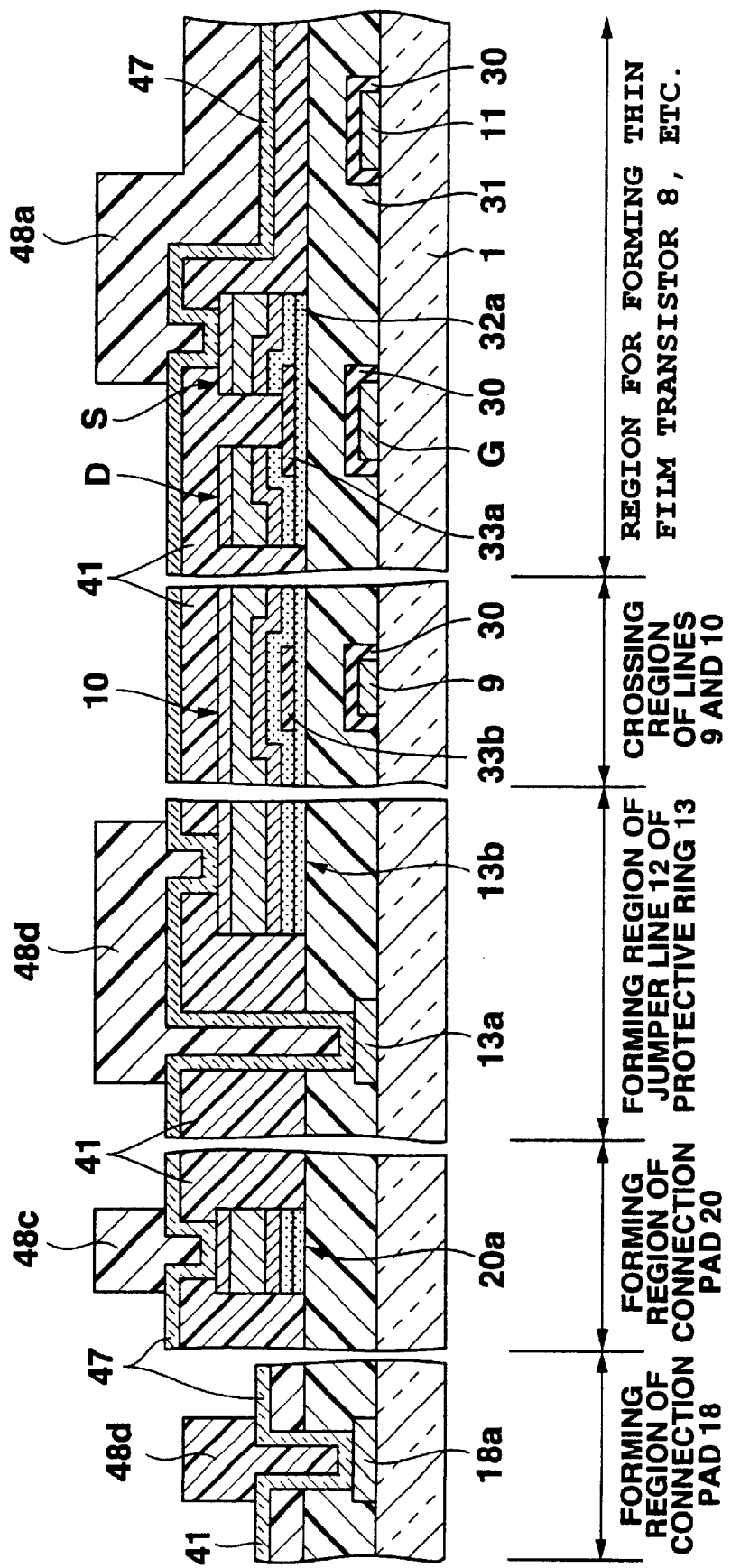
FIG. 29 is a cross sectional view showing a magnified portion of the thin film transistor panel for explaining the step following the step shown in FIG. 28.
Figure 30:
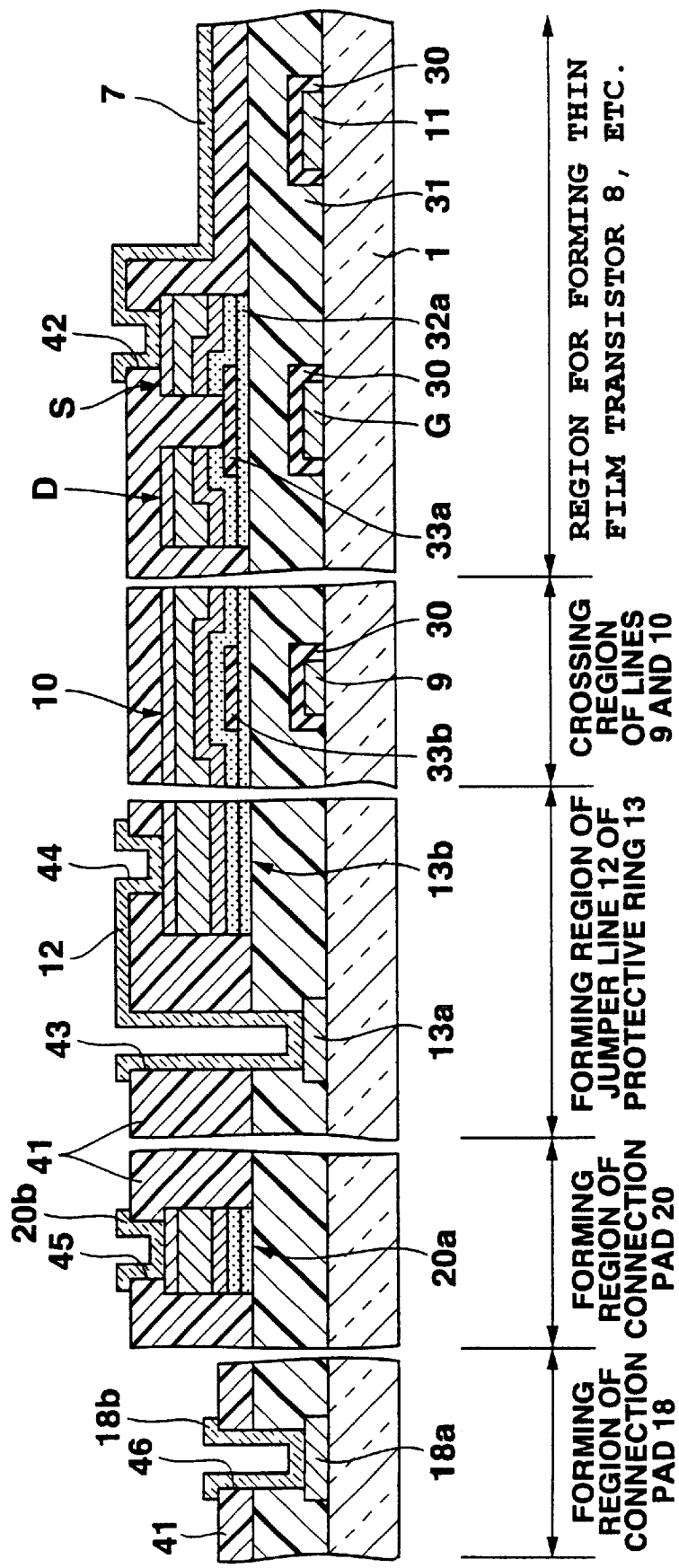
FIG. 30 is a cross sectional view showing a magnified portion of the thin film transistor panel for explaining the step following the step shown in FIG. 29.

Further, the remaining portion 13b of the protective ring 13, i.e., the left side portion of the protective ring 13 shown in FIG. 20, is formed. In this case, the remaining portion 13b of the protective ring 13, which is hereinafter referred to as the "upper portion protective ring 13b" is of a laminate structure consisting of the semiconductor film 32, the n-type amorphous silicon film 35 and the metal film 37, which are laminated in the order mentioned as viewed from below. Then, the third photoresist films 39a to 39d are peeled off.

Then, in the overcoat film forming step S12 shown in FIG. 1, the overcoat film 41 (see FIG. 7) consisting of a silicon nitride film is formed. Further, in the fourth photoresist forming step S13 shown in FIG. 1, the fourth photoresist film (not shown) is formed on the upper surface of the overcoat film 41. Still further, in the contact hole forming step S14 shown in FIG. 1, contact holes are formed in predetermined positions of the overcoat film 41 and the gate insulating film 31, followed by removing the fourth photoresist film.

Figure 7:
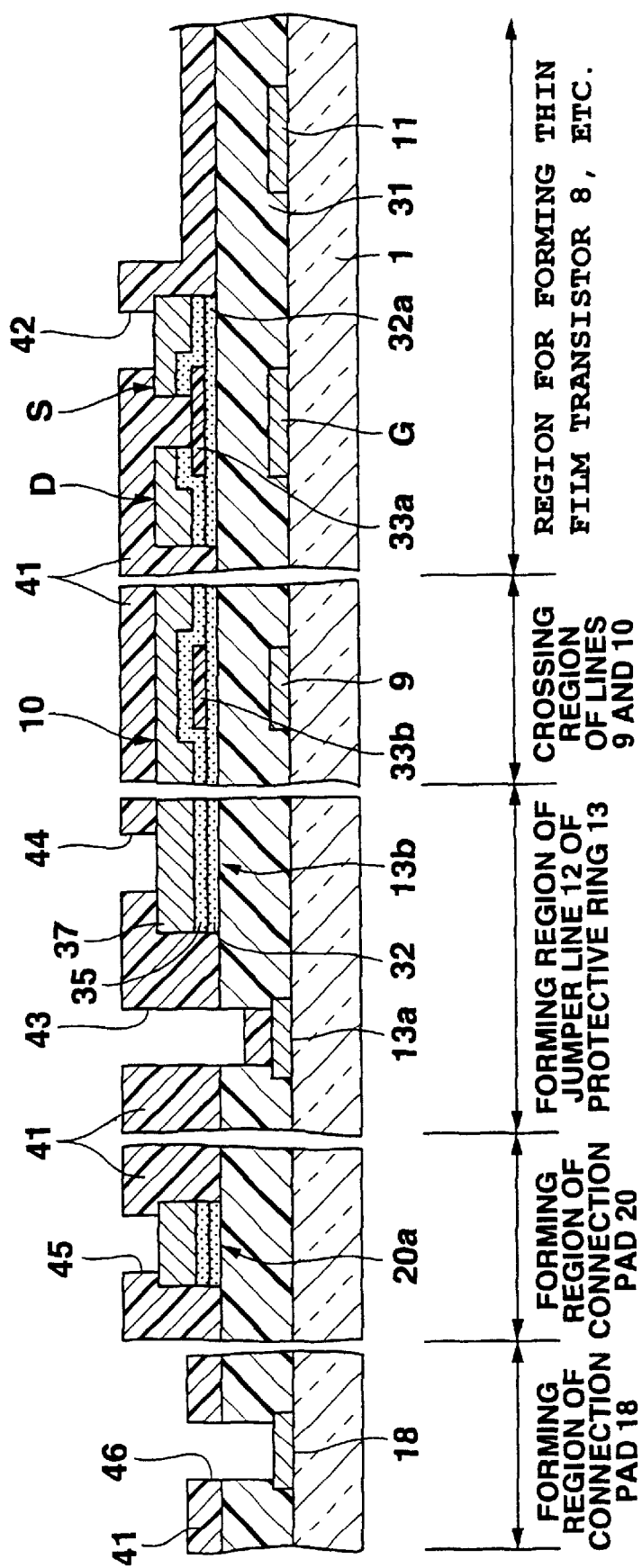
FIG. 7 is a cross sectional view showing a magnified portion of the thin film transistor panel for explaining the step following the step shown in FIG. 6.

As a result, in the region for forming the thin film transistor 8, etc., the contact hole 42 is formed in that portion of the overcoat film 41 which corresponds to the source electrode S as shown in FIG. 7. Also, in the region for forming the jumper line 12 of the protective ring 13, the contact hole 43 is formed in those portions of the overcoat film 41 and the gate insulating film 31 which correspond to the connecting portion of the lower portion protective ring 13a. Also, the contact hole 44 is formed in that portion of the overcoat film 41 which corresponds to the connecting portion of the upper portion protective ring 13b. Further, in the region for forming the connection pad 20, the contact hole 45 is formed in that portion of the overcoat film 41 which corresponds to the lower layer connection pad 20a. Still further, the contact hole 46 is formed in those portions of the overcoat film 41 and the gate insulating film 31 which correspond to the connection pad 18.

Figure 8:
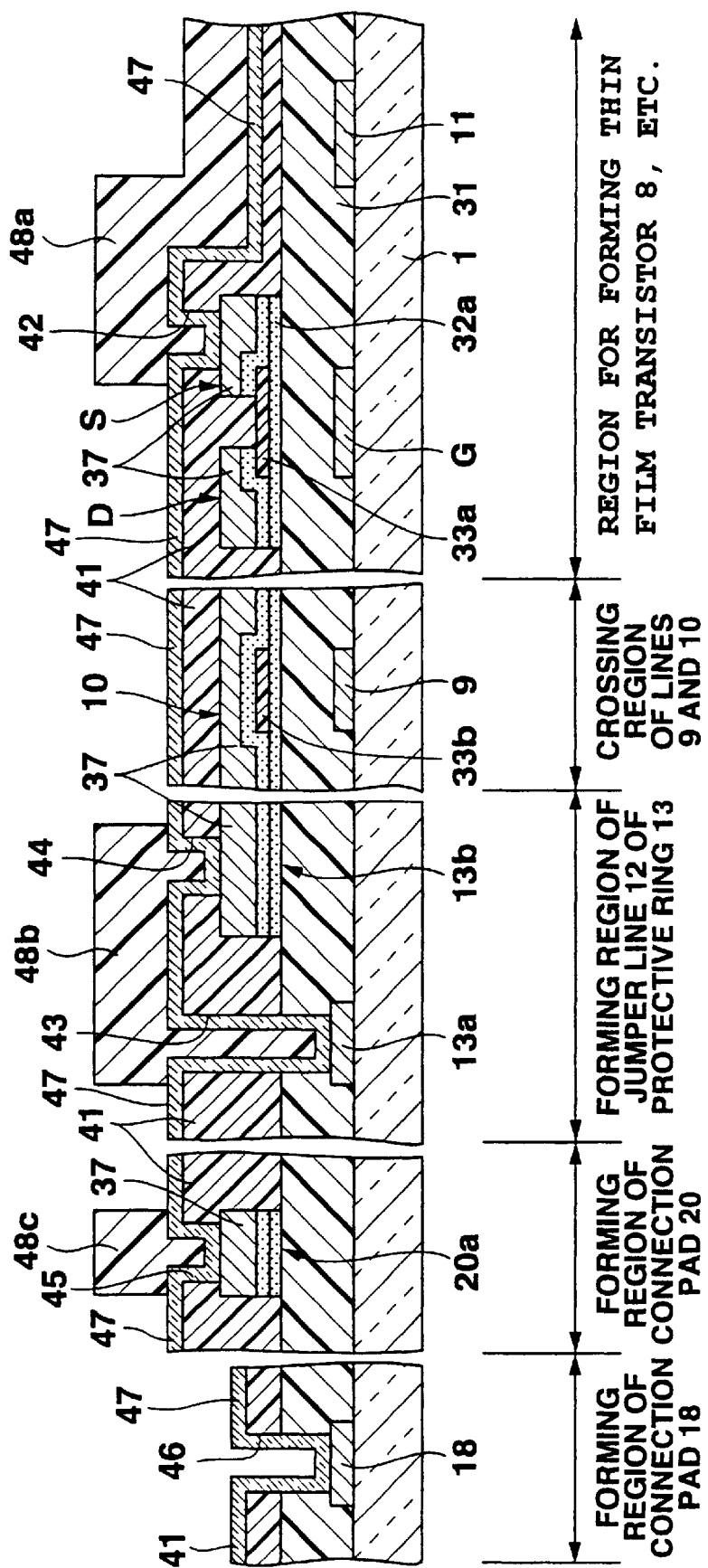
FIG. 8 is a cross sectional view showing a magnified portion of the thin film transistor panel for explaining the step following the step shown in FIG. 7.

Then, in the ITO film forming step S15 shown in FIG. 1, the ITO film 47 is formed as shown in FIG. 8. Further, in the fifth photoresist forming step S16 shown in FIG. 1, the fifth photoresist films 48a to 48c are formed in predetermined positions on the upper surface of the ITO film 47. In this case, the fifth photoresist film 48a is for forming the pixel electrode 7. The fifth photoresist film 48b is for forming the jumper line 12 of the protective ring 13. Further, the fifth photoresist film 48c is for forming the upper layer connection pad 20b of the connection pad (data electrode terminal) 20.

Figure 9:
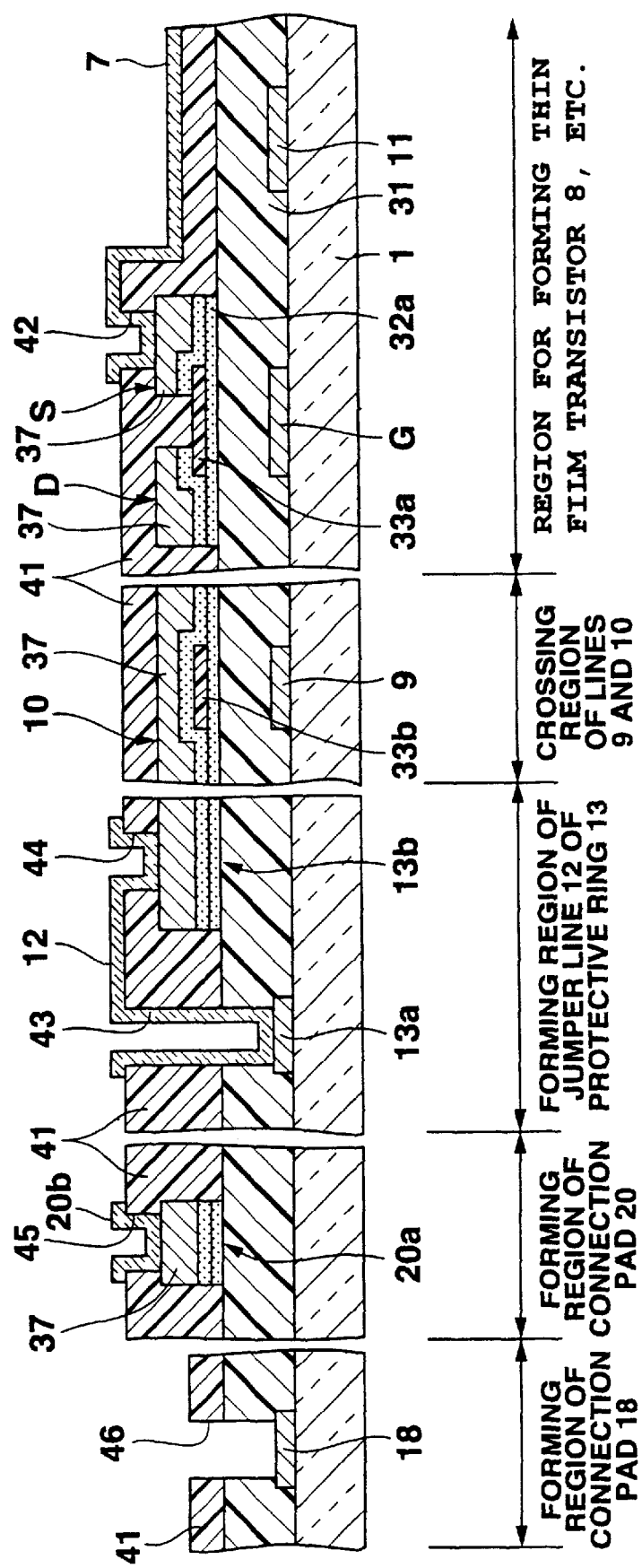
FIG. 9 is a cross sectional view showing a magnified portion of the thin film transistor panel for explaining the step following the step shown in FIG. 8.
Figure 10:
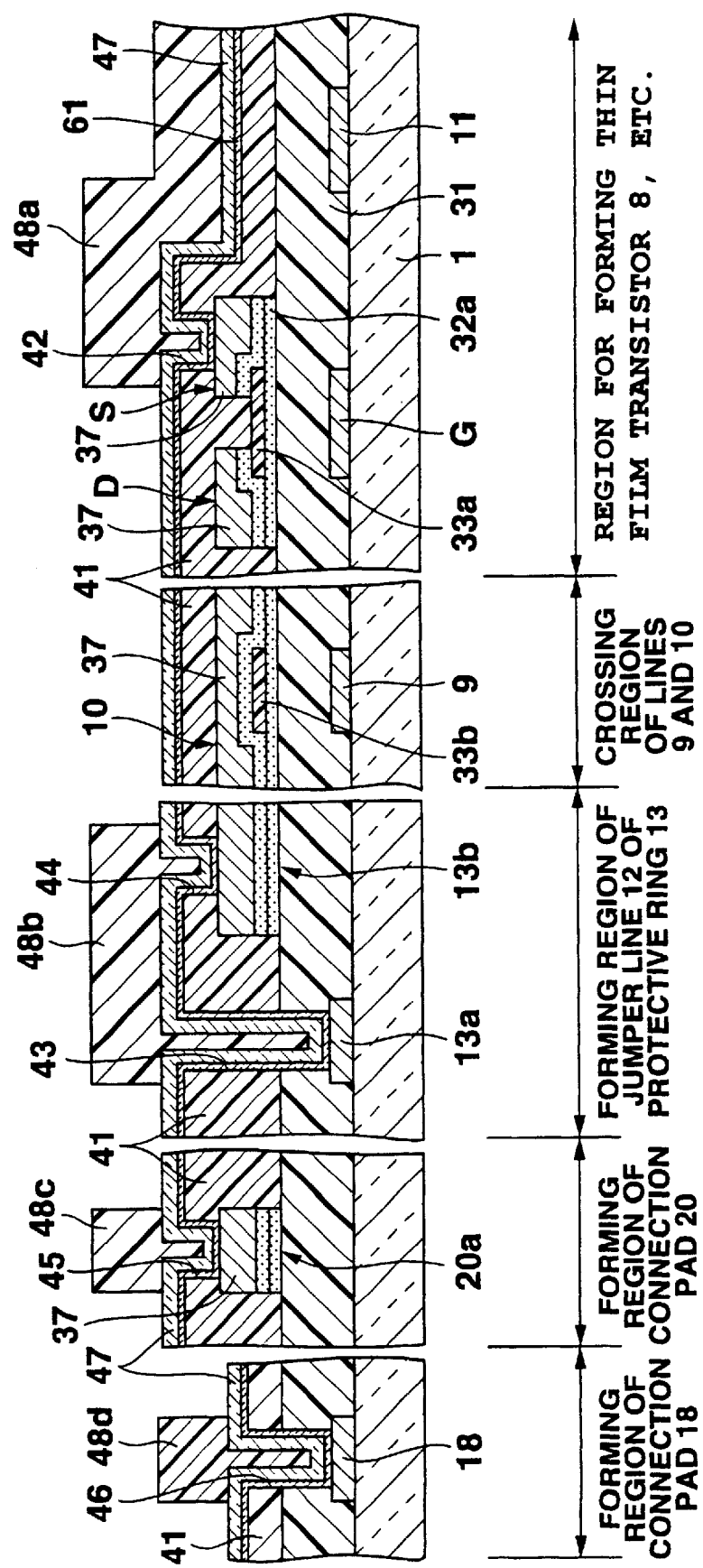
FIG. 10 is a cross sectional view showing a magnified portion of a thin film transistor panel for explaining the manufacturing process of a thin film transistor panel according to a second embodiment of the present invention.

Then, in step S17 for forming the pixel electrode, etc. shown in FIG. 1, the ITO film 47 is etched with the fifth photoresist films 48a to 48c used as a mask. In this case, since a photoresist film is not formed on the connection pad (scanning electrode terminal) 18 as apparent from in FIG. 8, the connection pad (scanning electrode terminal) 18 consisting of the Al-based metal film is exposed to the outside, as shown in FIG. 9. Therefore, if the ITO film 47 is etched by means of a wet etching method, the exposed Al-based metal film reacts with and is dissolved by the etchant of the ITO film. Also, since the Al-based metal film is connected to the ITO film via the protective ring 13, both the Al-based metal film and the ITO film are corroded by the so-called cell reaction in which the Al-based metal film is oxidized with the etchant of the ITO film, and the ITO film is reduced. Such being the situation, the present invention is featured in that the ITO film is etched by means of a dry etching method.

The dry etching method of the ITO film will now be described in detail.

Figure 14:
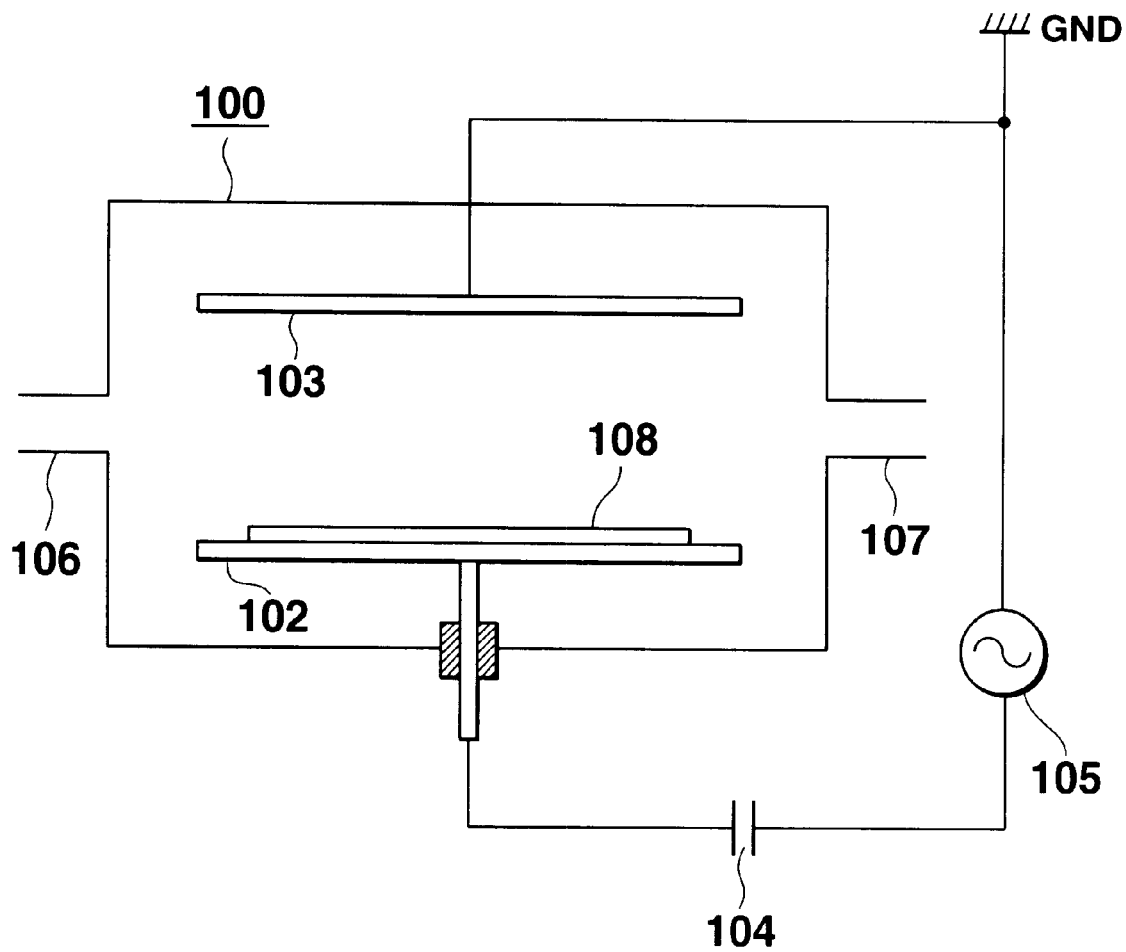
FIG. 14 schematically shows the construction of an apparatus for forming a transparent electrode of a thin film transistor panel, i.e., a reactive ion etching (RIE) apparatus.

FIG. 14 schematically shows the construction of a transparent electrode forming apparatus, i.e., a reactive ion etching (RIE) apparatus. The RIE apparatus is of a cathode coupling type and comprises a reaction vessel 100. A lower electrode (cathode) 102 and an upper electrode (anode) 103 are arranged in the lower portion and the upper portion, respectively, of the reaction vessel 100. The lower electrode 102 is connected to an RF power source 105 via a blocking capacitor 104. On the other hand, the upper electrode 103 is grounded. A gas inlet port 106 is formed in the left portion of the reaction vessel 100, and a gas discharge port 107 is formed in the right portion of the reaction vessel 100. The gas inlet port 106 is connected to a gas supply means (not shown) for supplying a mixed gas consisting of a hydrogen iodide gas (hydrogen halide gas) and a helium gas (inert gas) into the reaction vessel 100. A sample 108 disposed on the lower electrode 102 is a thin film transistor panel including the glass substrate 1 and the various members formed on the glass substrate 1 such as a large number of the thin film transistors 8, the overcoat film 41 covering these thin film transistors 8, the ITO film 47 formed on the overcoat film 41 and the photoresist films 48a to 48c formed on the ITO film 47, as shown in FIG. 8.

For applying a dry etching treatment to the ITO film 47 of the sample 108 by using the RIE apparatus shown in FIG. 14, the gas within the reaction vessel 100 is discharged to the outside through the gas discharge port 107 so as to set up a vacuum state within the reaction vessel 100. Then, a mixed gas consisting of a hydrogen iodide gas and a helium gas, which is supplied from the gas supply means, is introduced into the reaction vessel 100 through the gas inlet port 106. In this case, the pressure within the reaction vessel 100 is set at 3 Pa, and an RF power of 2.4 kW having a frequency of 13.56 MHz is applied from the RF power source 106.

Figure 15:
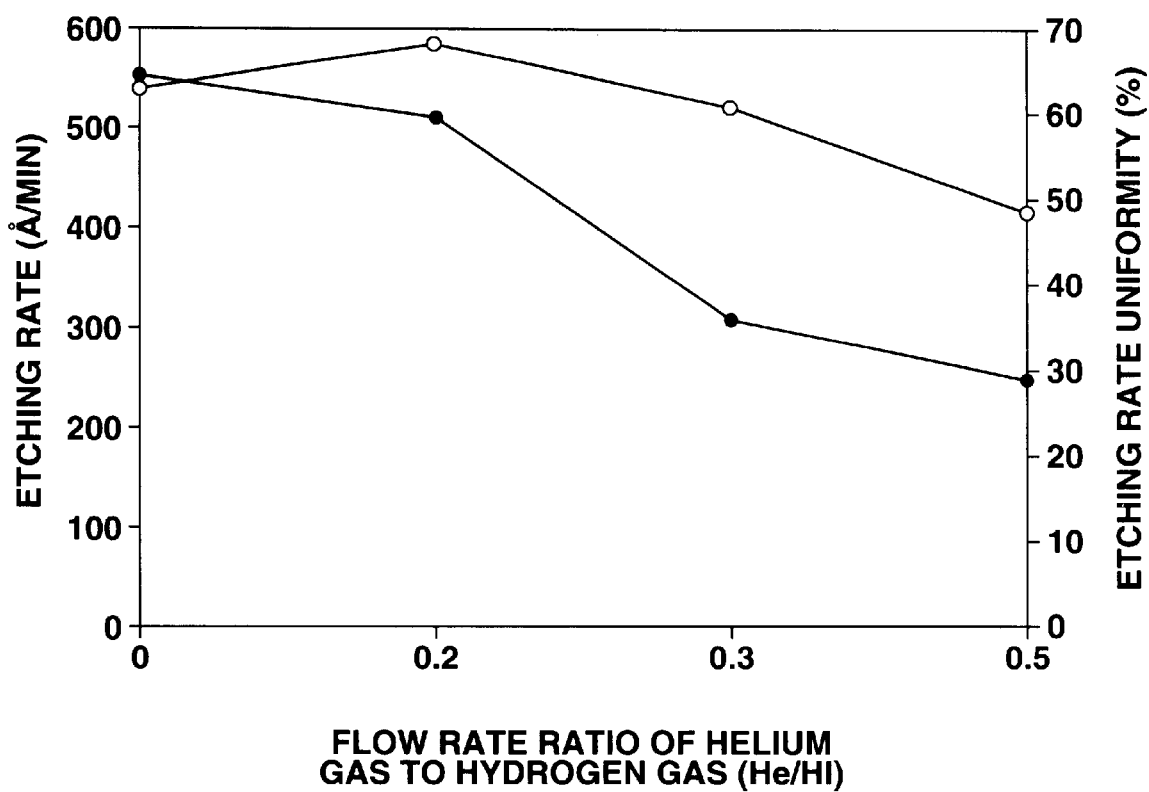
FIG. 15 is a graph showing the relationship between the flow rate ratio of the helium gas to the hydrogen iodide gas (He/HI) and the etching rate and the relationship between said flow rate ratio and the etching rate uniformity in the case where the transparent electrode is etched using the transparent electrode forming apparatus shown in FIG. 14.

The etching rate and the etching rate uniformity of the ITO film of the sample 108 were examined by setting the total flow rate of the mixed gas at 200 ccm while changing the flow rate ratio (He/HI) of the helium gas to the hydrogen iodide gas. FIG. 15 is a graph showing the experimental data. The white dots shown in the graph represent the etching rate, with the black dots representing the etching rate uniformity. The etching rate uniformity is denoted by the formula, (E1−E2)/(E1+E2)×100%, where E1 and E2 represent the maximum value and the minimum value, respectively, of the etching rate. The smaller value of the formula given above denotes that the etching rate is more uniform.

In the case of using the hydrogen iodide gas alone as the dry etching gas, i.e., where the flow rate ratio (He/HI) shown in FIG. 15 is zero, the etching rate denoted by the white dot is about 550 Å/min, which is relatively high and, thus, is desirable. However, the etching rate uniformity, which is denoted by the black dot, is about 65%, which is relatively high and, thus, is not desirable. In other words, in the case of using the hydrogen iodide gas alone as the dry etching gas, it is certainly possible to obtain a high etching rate. However, the etching rate uniformity is rendered poor.

On the other hand, in the case of using a mixed gas consisting of hydrogen iodide gas and helium gas as a dry etching gas, the etching rate denoted by the white dot reaches a maximum value of about 590 Å/min when the flow rate ratio (He/HI) is 0.2 and is gradually lowered as the flow rate ratio is decreased or increased from the value noted above. To be more specific, the etching rate is not lower than 400 Å/min and, thus, is satisfactory, even if the flow rate ratio (He/HI) is increased to 0.5. On the other hand, the etching rate uniformity is decreased, i.e., improved, with increase in the flow rate ratio (He/HI). Particularly, the etching rate uniformity is prominently improved if the flow rate ratio (He/HI) exceeds 0.2.

It is considered reasonable to understand that the nonuniform etching rate of the ITO film of the sample 108 in the reactive ion etching using the hydrogen iodide gas ion is compensated by the physical sputtering effect produced by the helium gas ion. As a result, the etching rate can be rendered uniform by adding a helium gas to the hydrogen iodide gas. In this case, the etching rate denoted by the white dot is considered to be lowered to a relatively low value not larger than 400 Å/min if the flow rate ratio (He/HI) is increased to exceed 0.5, judging from the graph of FIG. 15. On the other hand, the etching rate uniformity denoted by the black dot is sharply improved if the flow rate ratio (He/HI) exceeds 0.2. It follows that it is desirable for the flow rate ratio (He/HI) to fall within a range of between 0.2 and 0.5. Also, if the flow rate ratio (He/HI) is 0.3, the etching rate is about 20 Å/min, which is relatively high, and the etching rate uniformity is about 35%, which is relatively low, as apparent from FIG. 15. It follows that it is more desirable for the flow rate ratio (He/HI) to be about 0.3.

Figure 16:
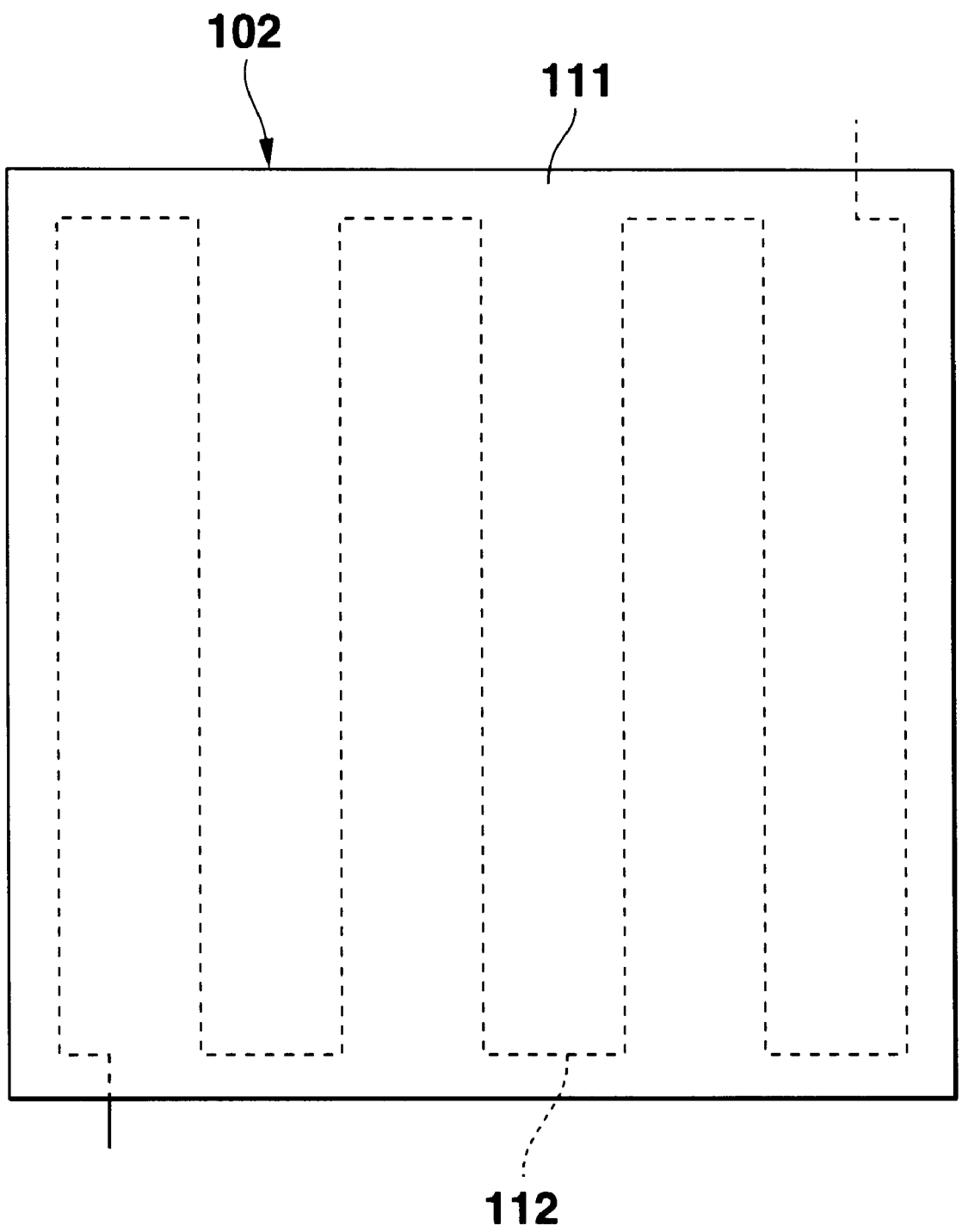
FIG. 16 is a plan view for explaining a first example of the lower electrode of the transparent electrode forming apparatus shown in FIG. 14.
Figure 17:
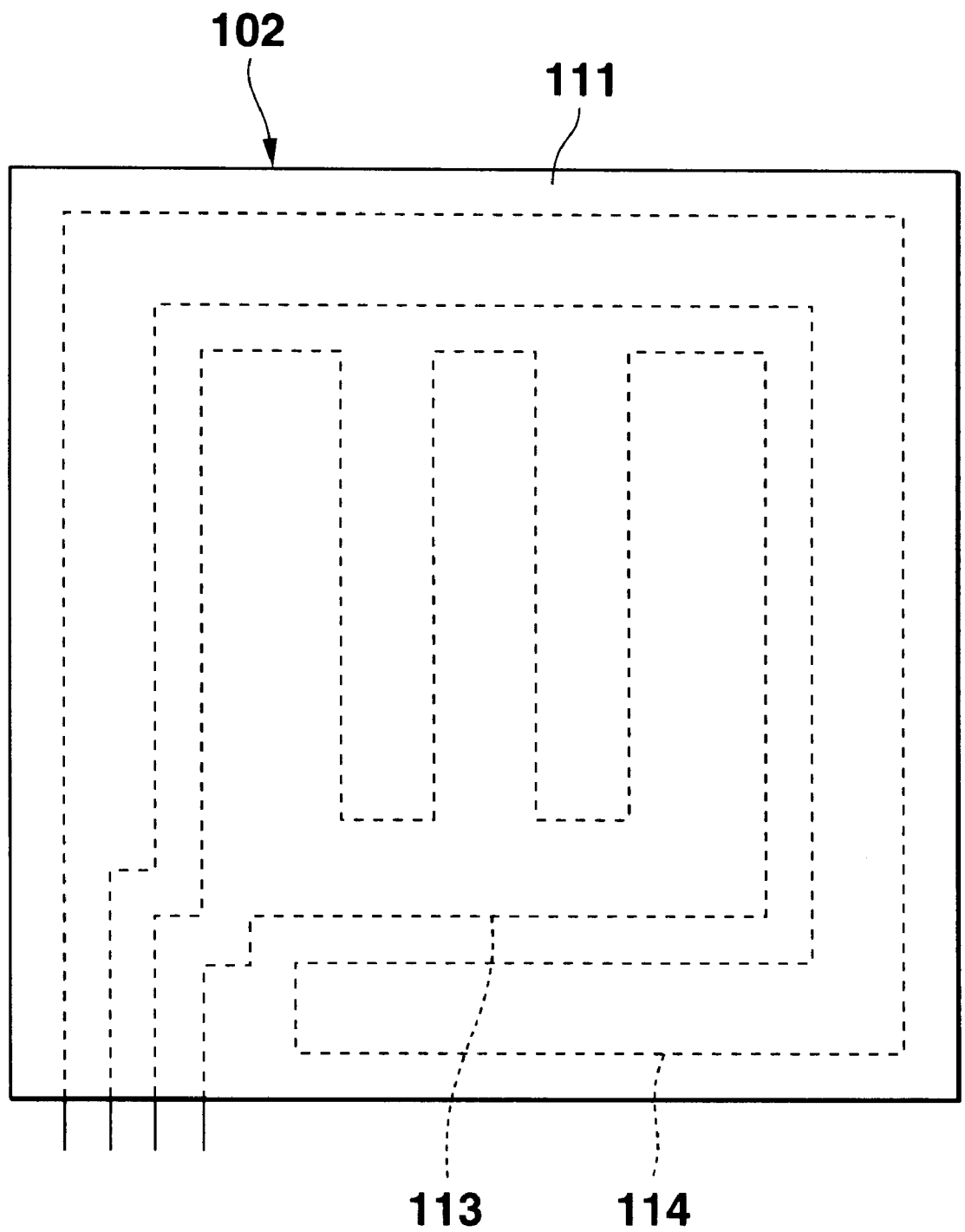
FIG. 17 is a plan view for explaining a second example of the lower electrode of the transparent electrode forming apparatus shown in FIG. 14.

Incidentally, the lower electrode 102 was prepared by arranging in a zigzag, a single pipe 112 within an electrode plate 111 sized at 340 mm×340 mm as shown in FIG. 16. A heating medium (galden) was circulated through the pipe 112 so as to set the substrate temperature of the sample 108 at 80° C. The lower electrode 102 was also prepared by arranging a single pipe 113 and another pipe 114 in the electrode plate 111 sized at 340 mm×340 mm. The pipe 113 was arranged in a zigzag and the other pipe 114 was arranged in a manner to surround the outer periphery of the pipe 113, as shown in FIG. 17. The heating medium (galden) was circulated through these pipes 113 and 114 so as to set the substrate temperature of the sample 108 at 80° C. in the central portion and at 110° C. in the outer peripheral portion. In this case, it is possible to control the substrate temperature within a range of between 30° C. and 110° C. Also, the flow rate of the hydrogen iodide gas was set at 175 ccm and The flow rate of the helium gas was set at 50 ccm such that the flow rate ratio (He/HI) was set at about 0.3. Further, the pressure within the reaction vessel was set at 6 Pa and an RF power of 2.5 kW, having a frequency of 13.56 MHz was applied from the RF power source 6.

The etching rate and the etching rate uniformity were measured under the conditions given above. It has been found that, in the case of using the lower electrode 102 equipped with the single pipe 112 (substrate temperature control mechanism of single system) shown in FIG. 6, the etching rate was about 700 Å/min and the etching rate uniformity was about 35%. On the other hand, in the case of using the lower electrode 102 equipped with the pipes 113 and 114 (substrate temperature control mechanism of two systems) shown in FIG. 17, the etching rate was about 900 Å/min and the etching rate uniformity was about 15%.

Figure 18:
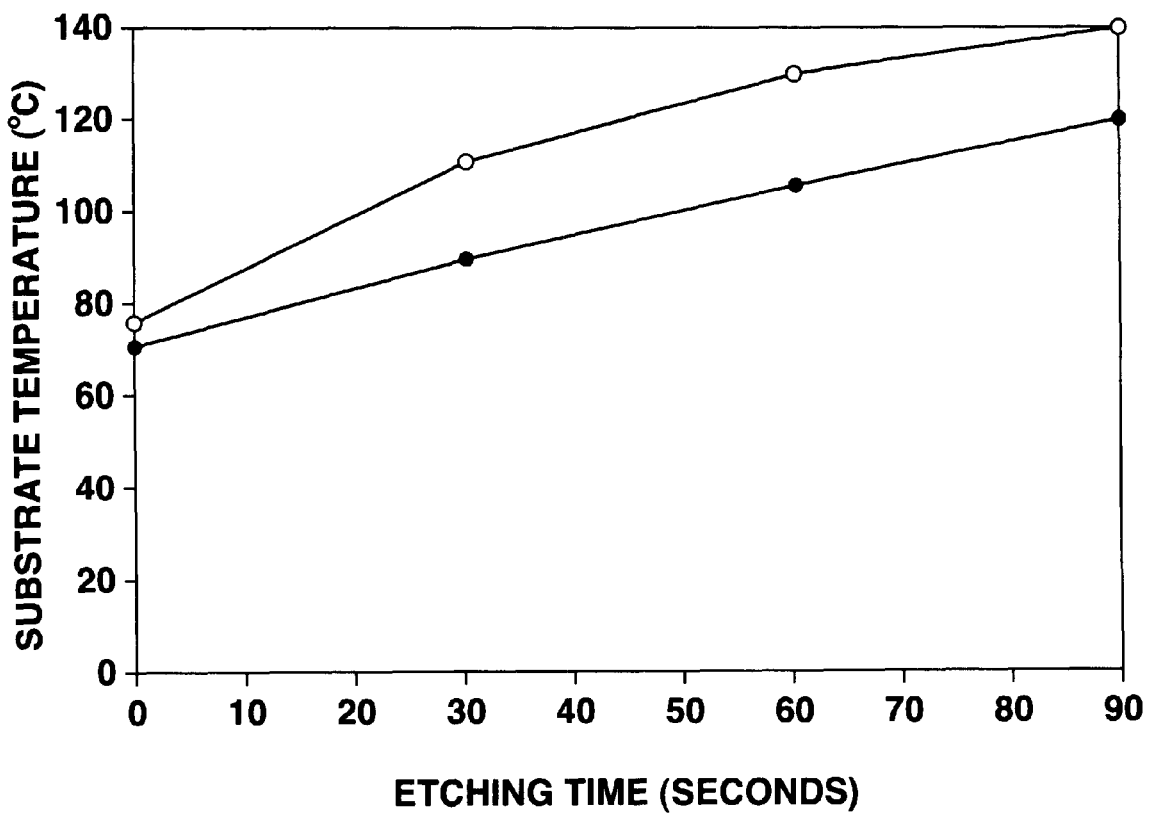
FIG. 18 is a graph showing the change with time in the substrate temperature in the case of using the lower electrode shown in FIG. 16.
Figure 19:
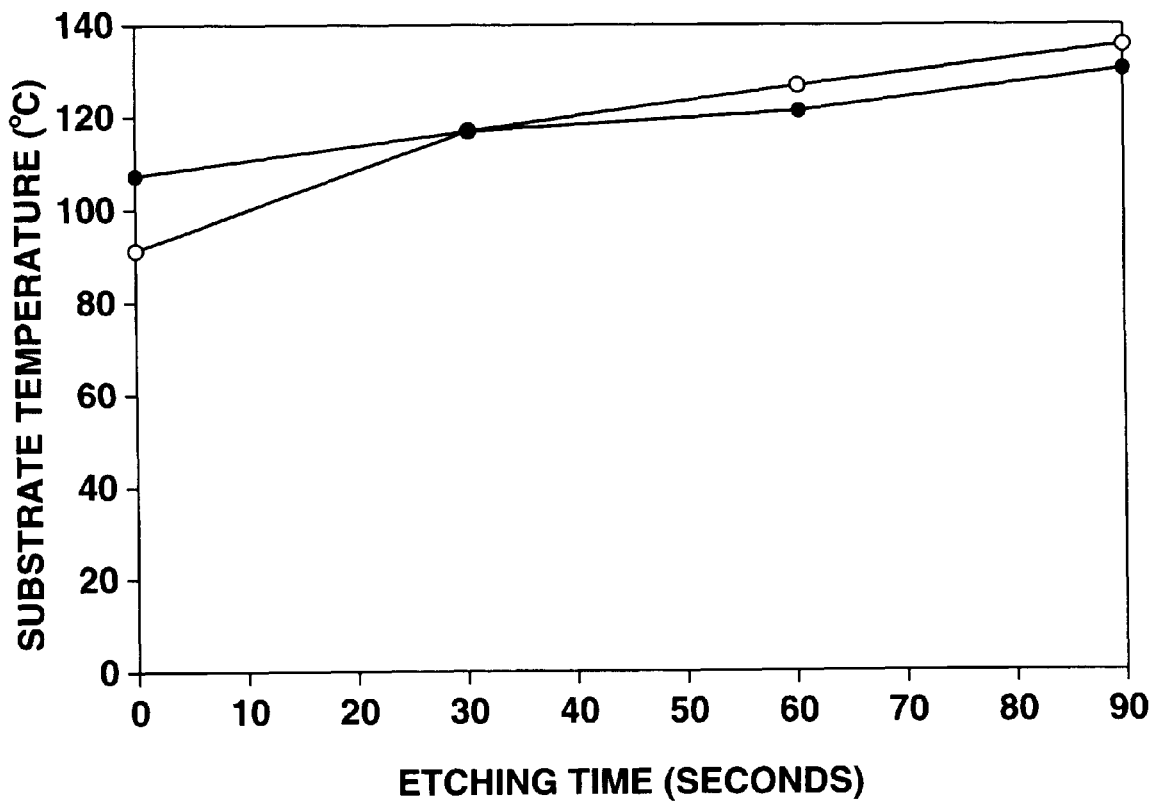
FIG. 19 is a graph showing the change with time in the substrate temperature in the case of using the lower electrode shown in FIG. 17.

The change with time in the substrate temperature of the sample 108 was examined in the case of using the lower electrode 102 equipped with the single pipe 112 as shown in FIG. 16, thereby obtaining the result as shown in the graph of FIG. 18. Also, the change with time in the substrate temperature of the sample 108 was examined in the case of using the lower electrode 102 equipped with the pipes 113 and 114 as shown in FIG. 17, thereby obtaining the result as shown in the graph of FIG. 19. In the graph of each of FIGS. 18 and 19, the white dots denote the temperature in the central portion of the substrate, with the black dots denoting the temperature in the outer peripheral portion of the substrate. The actual etching time (RF power applying time) was about 60 seconds.

As shown in FIG. 18, in the case of using the lower electrode 102 equipped with the single pipe 112 as shown in FIG. 16, the temperature in the central portion of the substrate, which is denoted by the white dots, was higher than the temperature in the outer peripheral portion of the substrate denoted by the black dots. On the other hand, in the case of using the lower electrode 102 equipped with the two pipes 113 and 114 as shown in FIG. 17, the temperature in the central portion of the substrate denoted by the white dots was substantially equal to the temperature in the outer peripheral portion of the substrate denoted by the black dots, as shown in FIG. 19.

It is considered reasonable to understand that the difference in the substrate temperature pointed out above causes the etching rate to be further increased to reach about 900 Å/min in the case of using the lower electrode 102 equipped with the two pipes 113 and 114 as shown in FIG. 17 in contrast to the etching rate of about 700 Å/min in the case of using the lower electrode 102 equipped with the single pipe 112 as shown in FIG. 16. It is also considered reasonable to understand that the difference in the substrate temperature pointed out above causes the etching rate uniformity to be further lowered to about 15% in the case of using the lower electrodes 102 equipped with the two pipes 113 and 114 as shown in FIG. 17 in contrast to about 35% in the case of using the lower electrode 102 equipped with the single pipe 112 as shown in FIG. 16.

The experimental data clearly support that, when the ITO film 47 of the sample 108 is subjected to a dry etching treatment, it is desirable for the substrate temperature to be set higher in the outer peripheral portion than in the central portion. It has also been found that it is desirable for the temperature difference between the central portion and the outer peripheral portion of the substrate, which was 30° C. in the experiment described above, to fall within a range of between 20° C. and 30° C.

It is desirable for the temperature in the outer peripheral portion of the substrate, which was 110° in the case of the experiment described above, to be not higher than the post-baking temperature, e.g., 125° C., of the photoresist formed on the ITO film 47 of the sample 108. In this case, the photoresist film can be peeled off easily in the subsequent step.

After the ITO film 47 is subjected to the dry etching treatment as described above, the fifth photoresist films 48a to 48c are peeled off. As a result, in the region for forming the thin film transistor 8, etc., the pixel electrode (transparent electrode) consisting of the ITO film is formed in a predetermined position on the upper surface of the overcoat film 41 in a manner to be connected to the source electrode S via the contact hole 42, as shown in FIG. 9. Also, in the region for forming the jumper line 12 of the protective ring 13, the jumper line 12 consisting of the ITO film is formed in a predetermined position on the upper surface of the overcoat film 41. In this case, one end portion of the jumper line 12 is connected to the lower portion protective ring 13a via the contact hole 43, with the other end portion being connected to the upper portion protective ring 13b via the contact hole 44.

Also, in the region for forming the connection pad 20, the upper layer connection pad 20b consisting of the ITO film is formed in a predetermined position on the upper surface of the overcoat film 41 in a manner to be connected to the lower layer connection pad 20a via the contact hole 45.

Under this state, the overcoat film 41 and the gate insulating film 31 are exposed to the outside in the contact hole 46 in the region for forming the connection pad 18, thereby obtaining a thin film transistor panel according to the first embodiment of the present invention.

As described above, in the manufacturing method of the thin film transistor panel according to the first embodiment of the present invention, the scanning signal line 9, etc., including the gate electrode G, are formed of the Al-based metal film that does not have an anodic oxide film on the surface, making it unnecessary to employ the anodic oxidation step. It follows that it is possible to decrease the number of manufacturing steps. It should be noted that the protective film 33b in the channel region of the semiconductor film 32 is formed by the dry etching method, as described previously. As a result, no damage is done to the gate insulating film even if there are defects such as pin holes in the semiconductor film 32. It follows that it is possible to prevent a short circuit between the gate electrode G and the source electrode S and between the gate electrode G and the drain electrode D. It is also possible to prevent the breakdown voltage of the gate insulating film 31 from being lowered. What should also be noted is that the pixel electrode 7 is formed by etching the ITO film 47 by means of the dry etching method in the first embodiment of the present invention. As a result, it is possible to prevent the cell reaction in the etching step even if the connection pad (scanning electrode terminal) 18 consisting of the Al-based metal film is exposed to the outside. Therefore, it is possible to form the connection pad (scanning electrode terminal) 18 by using only the Al-based metal film having a low resistivity, making it unnecessary to form an ITO film for preventing oxidation in the upper portion. It follows that it is possible to lower the contact resistance of a connector connected to the connection pad 18 and the contact resistance with an IC chip bonded by a COG (Chip on Glass) method so as to improve the reliability of the connection.

In the first embodiment described above, the uppermost layer of the lower layer connection pad 20a of the connection pad (data electrode terminal) 20 is formed of a metal such as Cr, Mo or Ta. Therefore, it is possible to lower the contact resistance even if the upper layer connection pad 20b, consisting of the ITO film, is formed on the lower layer connection pad 20a. However, since the connection pad (scanning electrode terminal) 18 is formed of an Al-base metal film, the contact resistance is increased if an ITO film is formed on the connection pad (scanning electrode terminal) 18. Under the circumstances, the connection pad (scanning electrode terminal) 18 is exposed to the outside in the contact hole 46 of the overcoat film 41 and the gate insulating film 31. However, in the construction that the connection pad (scanning electrode terminal) 18 is exposed to the outside in the contact hole 46 of the overcoat film 41 and the gate insulating film 31, a native oxide film is formed on the surface of the connection pad (scanning electrode terminal) 18, making it necessary to remove the native oxide film before a connector or an IC chip is bonded to the connection pad (scanning electrode terminal) 18.

Described in the following is a second embodiment of the present invention, which makes it possible to prevent a native oxide film from being formed on the surface of the connection pad (scanning electrode terminal) 18.

(Second Embodiment)

In the second embodiment of the present invention, it is possible to employ the technology of the first embodiment in respect of the process ranging between the first layer forming step S6 and the contact hole forming step S14 shown in FIG. 1. In the channel protective film forming step S6 included in the second embodiment of the present invention, the protective film-forming film 33 for forming the protective films 33a and 33b is etched by a dry etching method. it should be noted, however, that it is possible to use an Al-based metal film having a resistivity lower than that of Cr, Mo, Ta, etc. for forming the metal film 37 in the third layer forming step S4.

After the contact holes 42, 44, 45 are formed in the overcoat film 41 and the contact holes 43 and 46 are formed in the overcoat film 41 and the gate insulating film 31 in the contact hole forming step S14, the metal film 61 consisting of Cr, Mo, Ta, etc. is formed. The metal film 61 serves to improve the contact resistance between the Al-based metal film and the ITO film . It is desirable for the metal film 61 to have a thickness falling within a range of between 30 Å and 70 Å in order to ensure a sufficient light transmitting capability in the region of the pixel electrode 7 described herein later.

In the next step, the ITO film 47 is formed on the metal film 61. Further, the fifth photoresist films are formed in predetermined positions on the upper surface of the ITO film 47 as in the first embodiment. In this case, it is possible to form a fifth photoresist film 48d in addition to the photoresist films 48a, 48b and 48c. The photoresist film 48d is formed on the connection pad (scanning electrode terminal) 18 in a manner to cover the contact hole 6.

In the next step, the ITO film 47 is etched with the fifth photoresist films 48a to 48d used as a mask, followed by peeling off the fifth photoresist films 48a to 48d. As a result, in the region for forming the thin film transistor 8, etc., the pixel electrode 7 consisting of the ITO film as well as the metal film 61 formed below the pixel electrode 7 is formed in a predetermined position on the upper surface of the overcoat film 41 in a manner to be connected to the source electrode S via the contact hole 42. Also, in the region for forming the jumper line 12 consisting of the ITO film as well as the Cr-based metal film 61 is formed in a predetermined position on the upper surface of the overcoat film 41. In this case, one end portion of the jumper line 12 is connected to the lower portion protective ring 13a via the contact hole 43, with the other end portion being connected to the upper portion protective ring 13b via the contact hole 43.

Further, in the region for forming the connection pad 20, the upper layer connection pad 20 consisting of the ITO film as well as the Cr-based metal film 61 formed below the upper layer connection pad 20b is formed in a predetermined position on the upper surface of the overcoat film 41 in a manner to be connected to the lower layer connection pad 20a via the contact hole 45. Still further, in the region for forming the connection pad 18, the upper layer connection pad 18b consisting of the ITO film as well as the metal film 61 formed below the upper layer connection pad 18b is formed in a predetermined position on the upper surface of the overcoat film 41 in a manner to be connected to the connection pad 18 via the contact hole 46.

As described above, the scanning signal line 9, etc. including the gate electrode G is formed of the Al-based metal film that does not have an anodic oxide film on the surface in the manufacturing method of the thin film transistor panel according to the second embodiment of the present invention. As a result, the anodic oxidation step need not be employed, which decreases the number of manufacturing steps. Also, the upper layer connection pad 18b consisting of the ITO film is formed on the connection pad 18 of the scanning signal line 9 with the metal film 61 interposed therebetween, said metal film 61 having a redox potential higher than that of the Al-based metal film. In other words, a metal film having good contact characteristics is interposed between the Al-based metal film and the ITO film so as to improve the contact characteristics of the connection pad 18 consisting of three layers.

It should also be noted that the metal film 61 and the upper layer connection pad 20b consisting of the ITO film are formed on the connection pad 20 of the data signal line 10 so as to improve the contact characteristics of the connection pad 18. This is also the case with the contact characteristics between the pixel electrode 7 and the source electrode S, the contact characteristics of the connection pad 20 consisting of five layers, and the contact characteristics in the connecting portion of the jumper line 12. As a result, it is possible to use the Al-based metal film having a low resistivity for forming not only the scanning signal line 9 but also the data signal line 10 so as to improve the uniformity of the displayed image.

(Third Embodiment)

Figure 12:
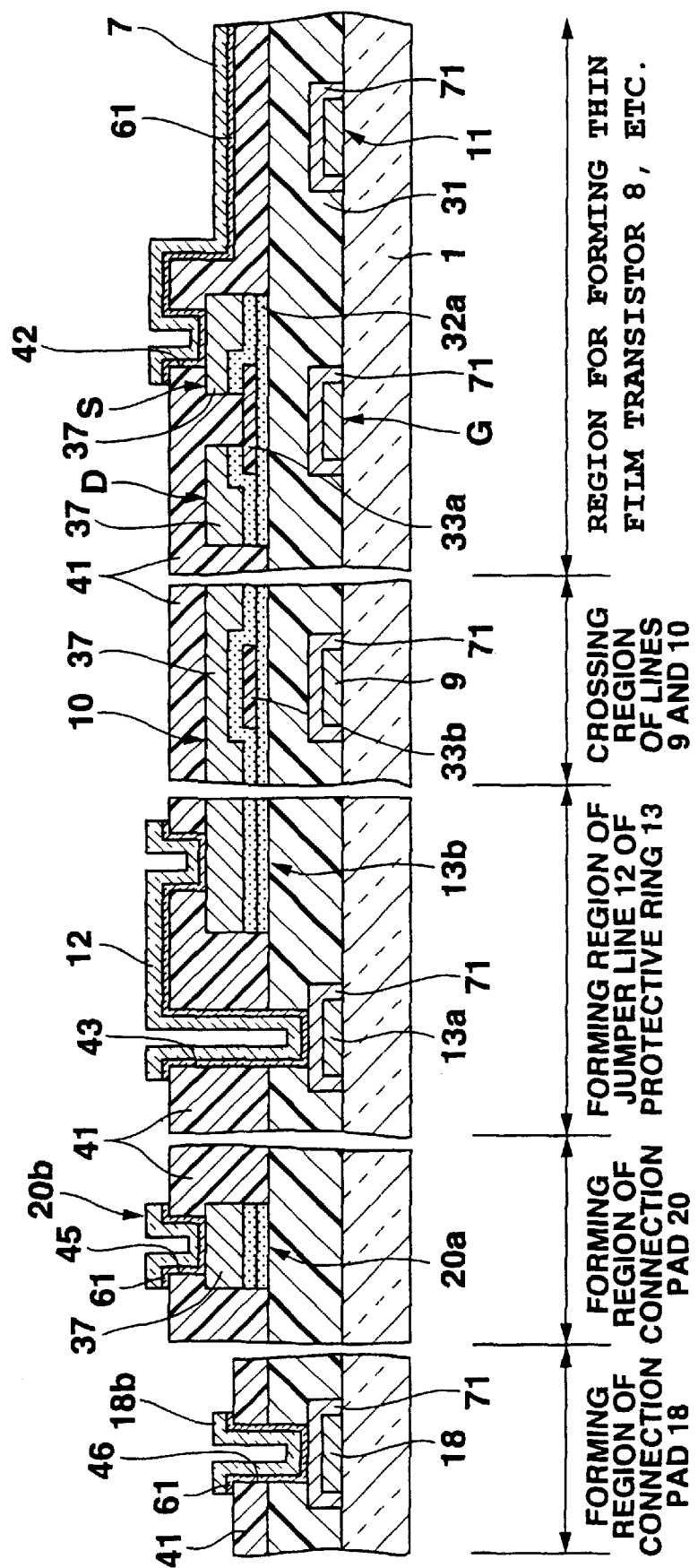
FIG. 12 is a cross sectional view showing a magnified portion of a thin film transistor panel for explaining the manufacturing process of a thin film transistor panel according to a third embodiment of the present invention.
Figure 13:
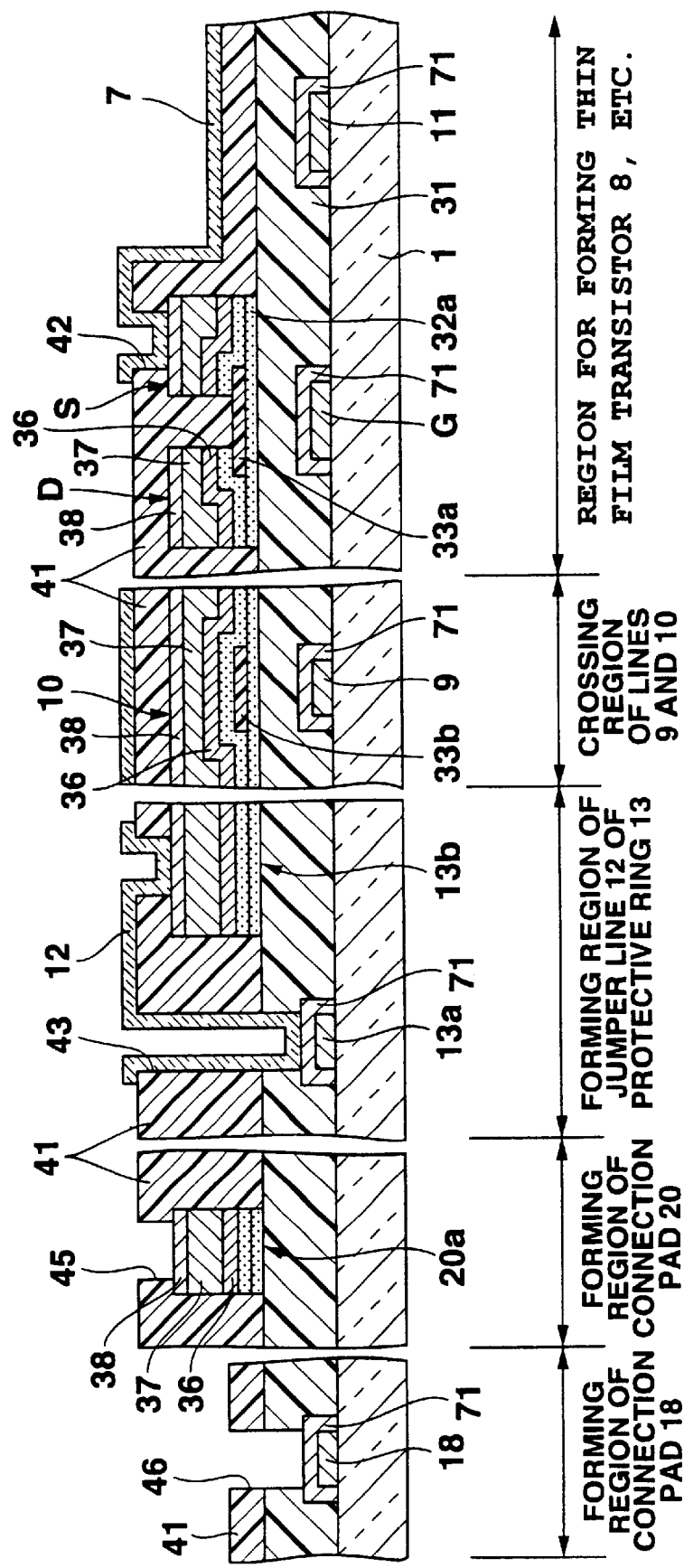
FIG. 13 is a cross sectional view showing a magnified portion of a thin film transistor panel for explaining the manufacturing process of a thin film transistor panel according to a fourth embodiment of the present invention.

FIG. 12, which is used for describing the third embodiment of the present invention, is a cross sectional view showing a magnified thin film transistor panel after completion of the manufacturing process.

In the third embodiment, the scanning signal line 10 comprises an Al-based metal film and a plating film 71 consisting of Cr, Ni, Mo, Ti, Ta, etc. and plated on the entire surface of the Al-based metal film. How to prepare the particular scanning signal line 10 will now be described.

In the first layer forming step S1 shown in FIG. 1, an Al-based metal film is formed on the upper surface of the glass substrate. Then, in the first photoresist forming step S2 shown in FIG. 1, a first photoresist film is formed on the upper surface of the Al-based metal film. In this case, the first photoresist film is patterned such that the power supply line 16 to which all the scanning signal lines 9 are connected is integrally formed with all the scanning signal lines 9 as shown in FIG. 20. Then, in the scanning signal line forming step S3 shown in FIG. 1, the Al-based metal film is etched with the first photoresist film used as a mask so as to form the scanning signal line 9. Further, an electroplating treatment is applied to the scanning signal line 9 via the power supply line 16 so as to form the plating film 71 on the entire surface of the scanning signal line 9. The subsequent steps are equal to those in the first embodiment and, thus, the description thereof is omitted.

In the third embodiment, the plating film 71 and the metal film 37 are formed of the same material so as to increase the bonding strength between the plating film 71 and the metal film 37. Also, the contact resistance between the plating film 71 and the metal film 37 is decreased so as to further improve the reliability.

(Fourth Embodiment)

In the fourth embodiment of the present invention, the scanning signal line 10 comprises an Al-based metal film and the plating film 71 formed on the surface of the Al-based metal film, as in the third embodiment described above. Also, an ITO film is not formed on the connection pad (scanning electrode terminal) 18 and on the connection pad (data electrode terminal) 20 so as to permit these connection pads 18 and 20 to be exposed to the contact hole 45 or 46. It should be noted that each of the pixel electrode 7 and the jumper line 12 is formed of an ITO film alone. The plating film 71 is formed on the scanning signal line 10 as in the third embodiment. Also, for forming the construction that an ITO film is not formed on the connection pad (data electrode terminal) 20 and the connection pad 20 is exposed to the contact hole 45, the ITO film 47 is etched under the state shown in FIG. 8 without forming the photoresist film 48c on the connection pad 20.

In the fourth embodiment of the present invention, each of the drain electrode D and the source electrode S is of a three layer structure comprising the Al-based metal film 37 and the metal films 36 and 38 sandwiching the metal film 37 therebetween and each consisting of Cr, Mo, Ta, etc. as in the conventional structure. For preparing each of the drain electrode D and the source electrode S of the particular construction, the particular three layers are successively formed by the sputtering method as in the prior art. Alternatively, it is possible to form the lower layer metal film 36 and the intermediate metal film 37, followed by patterning these metal films 36 and 37 in the shape including the power supply line (not shown) to which all the data signal lines 9 are connected and subsequently forming the upper layer metal film 37a by the electroplating. Of course, it is possible for the metal film 37 in the fourth embodiment of the present invention to be of a single layer structure consisting of Cr, Mo, Ta, etc.

As described above, in the method of the present invention for manufacturing a thin film transistor panel, the scanning signal line 9, etc. including the gate electrode G are formed of an Al-based metal film that does not have an anodic oxide film formed on the surface, making it unnecessary to employ the anodic oxidation step. As a result, the number of manufacturing steps can be decreased. It should be noted that the protective film 33b in the channel region of the semiconductor film 32 is formed by the dry etching method in the present invention, with the result that no damage is done to the gate insulating film even if the semiconductor film 32 has defects such as pin holes. It follows that it is possible to prevent a short circuit between the gate electrode G and the source electrode S or between the gate electrode G and the drain electrode D. In addition, it is possible to prevent the breakdown voltage of the gate insulating film 31 from being lowered.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a thin film transistor panel comprising:

forming a scanning signal line, including a connection pad and a gate electrode section, on a substrate, said scanning signal line, including the connection pad and the gate electrode section, being formed of a conductive metal film;

forming a gate insulating film on said substrate and said scanning signal line;

forming a semiconductor film on said gate insulating film;

forming a protective film-forming film on said semiconductor film;

patterning said protective film-forming film by dry etching so as to form a protective film in a region of said semiconductor film which corresponds to said gate electrode section;

forming a drain electrode connected to a first region of said semiconductor film exposed to the outside from both sides of said protective film, and forming a source electrode connected to a second region;

forming an upper insulating film to cover the drain electrode, the source electrode and the gate insulating film; and forming a transparent electrode connected to said source electrode on said upper insulating film.

2. The method of manufacturing a thin film transistor panel according to claim 1, wherein said conductive metal film is formed of aluminum or an aluminum alloy.

3. The method of manufacturing a thin film transistor panel according to claim 1, wherein said gate insulating film and said protective film-forming film are formed of the same material.

4. The method of manufacturing a thin film transistor panel according to claim 1, wherein forming said transparent electrode comprises forming a contact hole in a region of said upper insulating film which corresponds to said source electrode, and forming contact holes in regions of said upper insulating film and said gate insulating film which correspond to said connection pad of said scanning signal line.

5. The method of manufacturing a thin film transistor panel according to claim 4, wherein forming said transparent electrode further comprises forming a transparent conductive metal film on an entire surface of said insulating film having the contact holes formed in the regions which correspond to said source electrode and to said connection pad of said scanning signal line, and subjecting said transparent conductive metal film to a dry etching treatment so as to form said transparent electrode.

6. The method of manufacturing a thin film transistor panel according to claim 5, wherein said transparent conductive metal film formed on said connection pad of said scanning signal line is removed when the transparent conductive metal film is subjected to the dry etching treatment.

7. The method of manufacturing a thin film transistor panel according to claim 6, wherein said dry etching treatment is carried out by a reactive ion etching using a mixed gas comprising a hydrogen iodide gas and an inert gas.

8. The method of manufacturing a thin film transistor panel according to claim 7, wherein a flow rate ratio of said inert gas to said hydrogen iodide gas falls within a range of between 0.2 and 0.5.

9. The method of manufacturing a thin film transistor panel according to claim 5, wherein a heating temperature of said substrate is set higher in a peripheral portion of the substrate than in a central portion of the substrate when said transparent conductive metal film is subjected to the dry etching treatment.

10. The method of manufacturing a thin film transistor panel according to claim 9, wherein the heating temperature of said substrate is set such that the heating temperature in the peripheral portion of the substrate is higher by 20° C. to 30° C. than the heating temperature in the central portion of the substrate.

11. The method of manufacturing a thin film transistor panel according to claim 4, wherein forming said transparent electrode further comprises forming a first transparent conductive metal film on an entire surface of said upper insulating film having the contact holes formed in the portions which correspond to said source electrode and to said connection pad of said scanning signal line, and forming an ITO film on said first transparent conductive metal film, and wherein said first transparent conductive metal film has a lower resistivity than the ITO film.

12. The method of manufacturing a thin film transistor panel according to claim 1, wherein forming said scanning signal line comprises forming a first scanning signal line using a conductive metal film having a low resistivity, and applying a metal plating to said first scanning signal line.

13. The method of manufacturing a thin film transistor panel according to claim 12, wherein forming said transparent electrode comprises forming contact holes in portions of said upper insulating film which correspond to said source electrode and to said connection pad of said scanning signal line.

14. The method of manufacturing a thin film transistor panel according to claim 12, wherein forming said transparent electrode further comprises forming a transparent conductive metal film on an entire surface of said upper insulating film having the contact holes formed in the portions which correspond to said source electrode to said connection pad of said scanning signal line, and subjecting said transparent conductive metal film to a dry etching treatment so as to form said transparent electrode.

15. A method of manufacturing a thin film transistor panel comprising:

forming a scanning signal line including a scanning electrode terminal and a gate electrode on a substrate;

forming a gate insulating film on said substrate and on said scanning signal line;

forming a semiconductor film, in which a channel region, a source region and a drain region are formed, on said gate insulating film;

forming a protective film-forming film on said semiconductor film;

patterning said protective film-forming film by a dry etching method so as to form a protective film in a region in which said channel region is formed;

forming a source electrode connected to a region of said semiconductor film in which a drain region is to be formed, and forming a data signal line including a drain electrode connected to the region in which the drain region is to be formed and a data electrode terminal, said data signal line having a redox potential higher than a redox potential of said scanning signal line;

forming an upper insulating film to cover said drain electrode, said source electrode and said gate insulating film, said upper insulating film having contact holes partly exposing said source electrode, said data electrode terminal and said scanning electrode terminal to the outside; and forming a transparent electrode on said upper insulating film, said transparent electrode being connected to a transparent conductive film covering said data electrode terminal and to said source electrode.

16. The method of manufacturing a thin film transistor panel according to claim 15, wherein said scanning signal line is formed of aluminum or an aluminum alloy.

17. The method of manufacturing a thin film transistor panel according to claim 15, wherein said gate insulating film and said protective film-forming film are formed of the same material.

18. The method of manufacturing a thin film transistor panel according to claim 15, wherein forming said transparent conductive film and said transparent electrode comprises forming a transparent conductive metal film on an entire surface of said upper insulating film, followed by subjecting said transparent conductive metal film to a dry etching treatment so as to form said transparent conductive film and said transparent electrode.

19. The method of manufacturing a thin film transistor panel according to claim 18, wherein said transparent conductive metal film formed on said scanning electrode terminal of said scanning signal line is removed when said transparent conductive metal film is subjected to the dry etching treatment.

* * * * *